United States Patent
Kodama et al.

(10) Patent No.: US 6,410,204 B1
(45) Date of Patent: Jun. 25, 2002

(54) POSITIVE PHOTORESIST COMPOSITION

(75) Inventors: Kunihiko Kodama; Kenichiro Sato; Toshiaki Aoai, all of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/669,907

(22) Filed: Sep. 27, 2000

(30) Foreign Application Priority Data

Sep. 27, 1999 (JP) .............................. 11-273160

(51) Int. Cl.$^7$ .............................................. G03F 7/004
(52) U.S. Cl. .................................. 430/270.1; 430/921
(58) Field of Search ............................ 430/270.1, 921

(56) References Cited

U.S. PATENT DOCUMENTS

| | | | |
|---|---|---|---|
| 4,491,628 A | 1/1985 | Ito et al. ............... 430/176 |
| 5,679,795 A | * 10/1997 | Yamachika et al. ......... 430/191 |
| 6,159,656 A | * 12/2000 | Kawabe et al. .......... 430/270.1 |
| 6,180,316 B1 | * 1/2001 | Kajita et al. ............. 430/270.1 |
| 6,207,342 B1 | * 3/2001 | Takechi et al. .......... 430/270.1 |
| 6,280,898 B1 | * 8/2001 | Hasegawa et al. ....... 430/270.1 |
| 6,284,429 B1 | * 9/2001 | Kinsho et al. ........... 430/270.1 |

FOREIGN PATENT DOCUMENTS

| | | |
|---|---|---|
| EP | 0 249 139 B1 | 12/1987 |
| JP | A-48-89003 | 11/1973 |
| JP | A-51-120714 | 10/1976 |
| JP | A-53-133429 | 11/1978 |
| JP | A-55-12995 | 1/1980 |
| JP | A-55-126236 | 9/1980 |
| JP | A-56-17345 | 2/1981 |
| JP | A-59-45439 | 3/1984 |
| JP | A-60-3625 | 1/1985 |
| JP | A-60-10247 | 1/1985 |
| JP | A-60-37549 | 2/1985 |
| JP | A-60-121446 | 6/1985 |
| JP | A-62-229242 | 10/1987 |
| JP | A-63-27829 | 2/1988 |
| JP | A-63-36240 | 2/1988 |
| JP | A-63-250642 | 10/1988 |
| JP | A-4-21975 | 1/1992 |
| JP | A-4-211258 | 8/1992 |
| JP | A-5-181279 | 7/1993 |
| JP | A-5-249682 | 9/1993 |
| JP | A-6-65332 | 3/1994 |
| JP | A-6-65333 | 3/1994 |

* cited by examiner

Primary Examiner—Rosemary Ashton
(74) Attorney, Agent, or Firm—Sughrue Mion, PLLC

(57) ABSTRACT

A positive photoresist composition comprising (A) a compound which generates a sulfonic acid having naphthalene structure by the irradiation with actinic rays of a wavelength of 220 nm or less or radiation, and (B) a resin whose solubility in an alkali developing solution increases by the action of an acid is disclosed.

10 Claims, No Drawings

POSITIVE PHOTORESIST COMPOSITION

FIELD OF THE INVENTION

The present invention relates to a positive photoresist composition which is used for the manufacture of semiconductors such as IC and the like, the manufacture of circuit boards for liquid crystals and thermal heads, and other photofabrication processes. More specifically, the present invention relates to a positive photoresist composition which is suitably used when actinic rays having a wavelength of 220 nm or less or radiation are used as exposure light sources.

BACKGROUND OF THE INVENTION

As positive photoresist compositions, chemically amplified resist compositions are disclosed in U.S. Pat. No. 4,491,628 and EP 249139. Chemically amplified positive resist compositions are pattern-forming materials for forming patterns on a substrate by generating an acid on an exposed area by irradiation with actinic rays or radiation and, by the reaction with the acid as a catalyst, transforming the solubilities in a developing solution of an irradiated area and a non-irradiated area with the active radiation.

As such examples, the combination of compounds which generate an acid by photolysis with acetal or O,N-acetal compounds (e.g., JP-A-48-89003 (the term "JP-A" as used herein means an "unexamined published Japanese patent application")), with ortho esters or an anide acetal compounds (e.g., JP-A-51-120714), with polymers having an acetal or ketal group at the main chain (e.g., JP-A-53-133429), with enol ether compounds (e.g., JP-A-55-12995), with N-acyliminocarbonic acid compounds (e.g., JP-A-55-126236), with polymers having an ortho ester group at the main chain (e.g., JP-A-56-17345), with tertiary alkyl ester compounds (e.g., JP-A-60-3625), with silyl ester compounds (e.g., JP-A-60-10247), and with silyl ether compounds (e.g., JP-A-60-37549 and JP-A-60-121446) can be exemplified. These combinations show high photosensitivity as quantum yields thereof exceed 1 in principle.

Similarly, as systems which are decomposed by heating in the presence of an acid and alkali-solubilized, e.g., the combination of compounds which generate an acid by exposure (e.g., those disclosed in JP-A-59-45439, JP-A-60-3625, JP-A-62-229242, JP-A-63-27829, JP-A-63-36240, JP-A-63-250642, JP-A-5-181279, *Polym. Eng. Sce.,* Vol. 23, p. 1012 (1983), *ACS. Sym.,* Vol. 242, p. 11 (1984), *Semiconductor World,* p. 91 (November, 1987), *Macromolecules,* Vol. 21, p. 1475 (1988), and *SPIE,* Vol. 920, p. 42 (1988)) with esters or carbonic ester compounds of tertiary or secondary carbons (e.g., t-butyl, 2-cyclohexenyl), with acetal compounds disclosed in JP-A-4-21975, JP-A-5-249682 and JP-A-6-65332, and with t-butyl ether compounds disclosed in JP-A-4-211258 and JP-A-6-65333 can be exemplified.

On the other hand, as photo acid generators, compounds which generate a camphorsulfonic acid and a substituted benzenesulfonic acid having low diffusibility are now under examination. Further, there is a problem that the compound having high diffusibility (e.g., triphenylsulfonium trifluoromethanesulfonic acid) lowers the resolution.

However, there arises another problem that if the compound generating an acid having low diffusibility is used, the resolution is comparatively high but sensitivity and a pattern-profile are inferior.

SUMMARY OF THE INVENTION

Accordingly, an object of the present invention is to provide a positive photoresist composition which is suitably used when an exposure light source having a wavelength of 220 nm or less is used, i.e., to provide a positive photoresist composition which is capable of obtaining a rectangular pattern profile and markedly excellent in sensitivity and resolution.

The above object of the present invention has been attained by the following means.

(1) A positive photoresist composition comprising (A) a compound which generates a sulfonic acid having naphthalene structure by the irradiation with actinic rays of a wavelength of 220 nm or less or radiation, and (B) a resin whose solubility in an alkali developing solution increases by the action of an acid.

(2) The positive photoresist composition as described in the above item (1), wherein the compound (A) is a compound represented by the following formula (I):

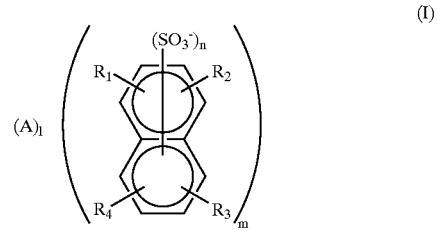

wherein A represents a sulfonium cation or an iodonium cation; $R_1$, $R_2$, $R_3$ and $R_4$, which may be the same or different, each represents a hydrogen atom, a hydroxyl group, a halogen atom, a sulfonyl group, an alkyl group, an alkoxyl group, an alkoxycarbonyl group, or an acyloxy group, at least one of $R_1$, $R_2$, $R_3$ and $R_4$ may be a group bonded to other sulfonic acid residual group via a linking group, and arbitrary two of $R_1$, $R_2$, $R_3$ and $R_4$ may be bonded to each other to form a ring by containing one or more bonding atomic group(s) selected from the group consisting of an alkylene group, —O—, —C(=O)—O—, —S—, and —CO—O—CO—; m, n and 1 each represents an integer of 1, 2 or 3, provided that m×n=1×(the valency of cation A).

(3) The positive photoresist composition as described in the above item (1) or (2), wherein the resin (B) contains monocyclic or polycyclic alicyclic hydrocarbon structure.

(4) The positive photoresist composition as described in the above item (1), (2) or (3), wherein the resin (B) contains lactone structure.

(5) The positive photoresist composition as described in the above item (1), (2), (3) or (4), which further contains (C) a basic compound.

(6) The positive photoresist composition as described in any of the above items (1) to (5), which further contains (D) a fluorine-based and/or a silicon-based surfactant. (7) The positive photoresist composition as described in any of the above items (1) to (6), which further contains (E) a low molecular weight compound having a molecular weight of 3,000 or less whose solubility in an alkali developing solution increases by the action of an acid.

A photosensitive composition is required to be excellent in limiting resolution. For increasing limiting resolution, it is important not to disturb an exposed latent image at the time of exposure. A photo acid generator contained in a photosensitive composition generates an acid by a decomposition reaction caused by exposure. When the acid generated by decomposition has high diffusibility, the exposed latent image is disturbed. Accordingly, it is thought to be important that the diffusibility of the acid generated by decomposition should be low. From that point of view, a sulfonic acid compound, in particular, a bulky sulfonic acid compound has attracted public attention. In place of triphenylsulfonium trifluoro-methanesulfonates, which have so far been used in general, photo acid generators which generate a camphor-sulfonic acid and a (substituted) benzenesulfonic acid by a photochemical reaction have been developed.

A camphorsulfonic acid has transparency to light of wavelength of 193 nm. This is a preferred characteristic but the generated acid is comparatively weak. Therefore, the deprotecting reaction using the acid as a catalyst is delayed, as a result, the sensitivity lowers.

Further, benzenesulfonic acid moieties which do not participate in the photolysis of photo acid generators which generate benzenesulfonic acids have a large absorbing power to light of wavelength of 193 nm. This light-absorbing power hinders the photolysis reaction and lowers the sensitivity. Further, there is a problem that a profile becomes tapered due to this light-absorbing power.

The present inventors have solved the above problem clearly by using a photo acid generator having specific structure as a photosensitive composition.

DETAILED DESCRIPTION OF THE INVENTION

Compounds which Generate Sulfonic Acid having Naphthalene Structure

In the present invention, a compound which generates a sulfonic acid having naphthalene structure by the irradiation with actinic rays of a wavelength of 220 nm or less or radiation is contained as one constituent. Actinic rays of a wavelength of 220 nm or less or radiation can be obtained from, e.g., an ArF eximer laser (193 nm), an $F_2$ eximer laser (157 nm), an X-ray, an electron beam, etc.

As the compounds which generate a sulfonic acid having naphthalene structure by the irradiation with actinic rays or radiation, sulfonate having naphthalene structure, disulfone having naphthalene structure, iminosulfonate having naphthalene structure, diazodisulfone having naphthalene structure, etc., can be exemplified.

Sulfonates having naphthalene structure are preferably used in the present invention. In this case, the anion is an anion of a sulfonic acid having naphthalene structure. The cation is preferably a sulfonium cation or an iodonium cation.

One or more —$SO_3$— group (s) may be bonded to the naphthalene ring in a sulfonic acid having naphthalene structure, in addition, the naphthalene ring may have a prescribed substituent. As the substituents which may be substituted on the naphthalene ring, a hydroxyl group, a halogen atom, a sulfonyl group, an alkyl group, an alkoxyl group, an alkoxycarbonyl group, an acyloxy group and an acyl group can be exemplified. Specific examples thereof are those represented by formula (I) shown later.

A sulfonium cation or an iodonium cation, which is the cation of sulfonate having naphthalene structure, is preferably represented by the following formula (a) or (b):

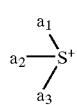

(a)

(b)

wherein $a_1$, $a_2$ and $a_3$ each independently represents an alkyl or aryl group each of which may have a substituent; and $b_1$ and $b_2$ each independently represents an aryl group which may have a substituent. As the aryl group, an aryl group having from 6 to 14 carbon atoms is preferred, and as further substituents thereof, e.g., an alkyl group having from 1 to 8 carbon atoms, an alkoxyl group having from 1 to 8 carbon atoms, a nitro group, a carboxyl group, a hydroxyl group, a halogen atom, and —S—R (wherein R represents an aryl group) can be exemplified. As the alkyl group, an alkyl group having from 1 to 8 carbon atoms is preferred, and as further substituents thereof, e.g., an alkoxyl group having from 1 to 8 carbon atoms, a carboxyl group, and an alkoxycarbonyl group can be exemplified. Two of $a_1$, $a_2$ and $a_3$, or $b_1$ and $b_2$ may be bonded. One of $a_1$, $a_2$ and $a_3$ may be a divalent group of a sulfur atom (—S—) or an oxygen atom (—O—), and may form a dimer with the divalent group as the center. For example, the structures such as the cation parts of specific examples (II-1) to (II-6) described later can be taken.

In the present invention, a compound represented by the above formula (I) is preferred as the sulfonate having naphthalene structure. In formula (I), A represents a sulfonium cation or an iodonium cation, which is preferably represented by the above formula (a) or (b).

As the examples of the alkyl group represented by $R_1$, $R_2$, $R_3$ and $R_4$ in formula (I), a methyl group, an ethyl group, a propyl group, a butyl group, a hexyl group, and an octyl group can be exemplified. As the examples of the alkoxyl group, a methoxy group, an ethoxy group, a propyloxy group, a butoxy group, a hexyloxy group, and an octyloxy group can be exemplified, as the alkoxycarbonyl group, a methoxycarbonyl group, an ethoxycarbonyl group, and a butoxycarbonyl group can be exemplified, and as the acyloxy group, an acetyloxy group, a propionyloxy group, and a trifluoroacetyloxy group can be exemplified. The alkyl group may be a straight chain, branched or cyclic group. The alkyl moieties of the alkoxyl group, the alkoxycarbonyl group and the acyloxy group may also be straight chain, branched or cyclic groups. Examples of the halogen atoms include, e.g., a chlorine atom, a fluorine atom, a bromine atom, and an iodine atom. $R_1$, $R_2$, $R_3$ and $R_4$ each preferably represents an alkyl group, a hydroxyl group, a halogen atom or an alkoxyl group.

At least one of $R_1$, $R_2$, $R_3$ and $R_4$ may be bonded to other sulfonic acid residual group via a linking group. Specifically, it means to bond to an arylsulfonic acid residual group or an alkylsulfonic acid residual group as further substituent of $R_1$, $R_2$, $R_3$ and $R_4$.

Further, arbitrary two of $R_1$, $R_2$, $R_3$ and $R_4$ may be bonded to each other to form a ring by containing one or more bonding atomic group (s) selected from the group consisting of an alkylene group, —O—, —C(=O)—O—, —S—, and —CO—O—CO—. The alkylene group is an alkylene group having from 1 to 5 carbon atoms.

m, n and l each represents an integer of 1, 2 or 3, provided that m×n=l×(the valency of cation A).

Formulae of preferred examples of cationic atomic group (generally called "A" in formula (I)) of the compounds which generate a sulfonic acid having naphthalene structure are shown below.

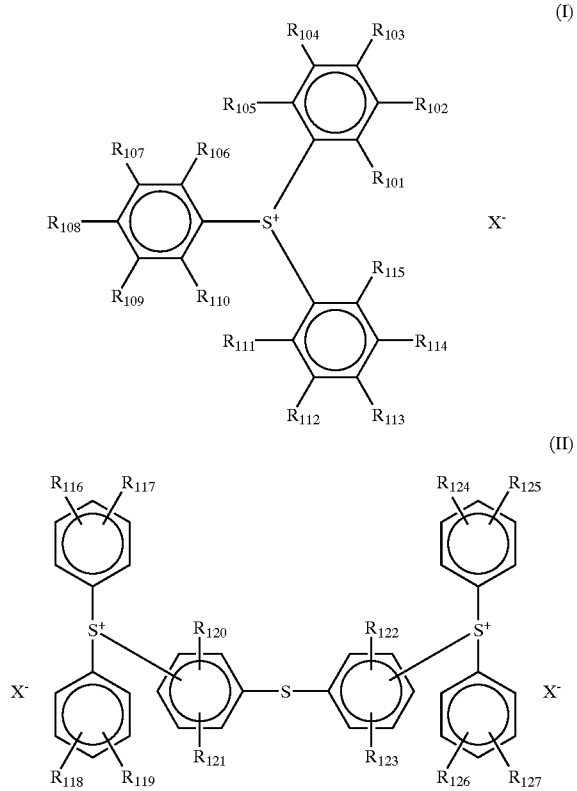

wherein $R_{101}$ to $R_{137}$, which may be the same or different, each represents a hydrogen atom, a straight chain, branched, or cyclic alkyl group, a straight chain, branched, or cyclic alkoxyl group, a hydroxyl group, a halogen atom, or an —S—$R_{138}$ group; $R_{138}$ represents a straight chain, branched, or cyclic alkyl group or aryl group, and two or more of $R_{101}$ to $R_{115}$ may be bonded to form a ring containing one or two or more selected from a single bond, a carbon atom, an oxygen atom, a sulfur atom and a nitrogen atom; and $R_{116}$ to $R_{127}$, and $R_{128}$ to $R_{137}$ may also form a ring.

$X^-$ represents an anion, which is the structure of the anion part of the compound comprehensively shown in formula (I).

In the present invention, as the compound which generates a sulfonic acid having naphthalene structure, the following compounds can be specifically exemplified. Compounds (I-1) to (IV-6) are the compounds represented by formula (I), and Compounds (V-1) to (V-14) are specific examples of disulfones having naphthalene structure, iminosulfonates having naphthalene structure, and diazodisulfones having naphthalene structure, respectively.

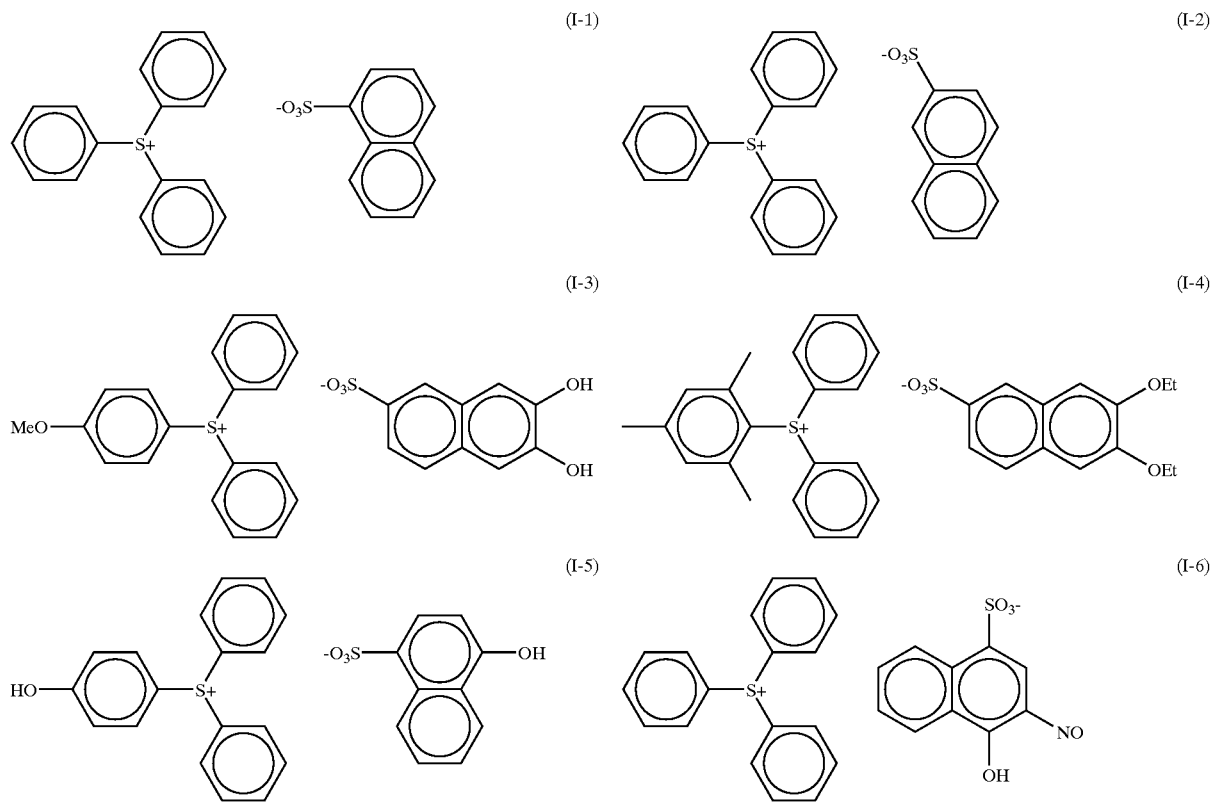

-continued
(I-7)
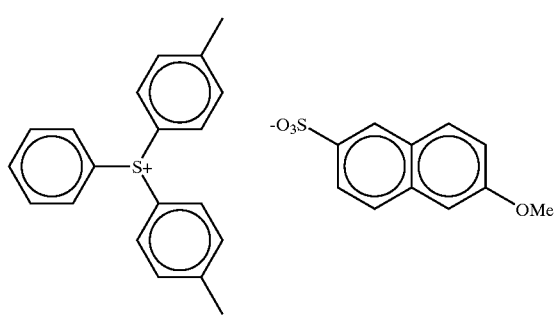
(I-8)
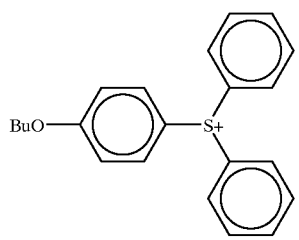
(I-10)
(I-9)
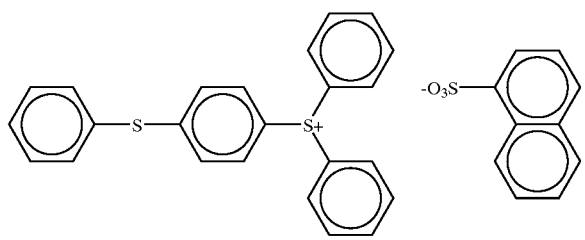
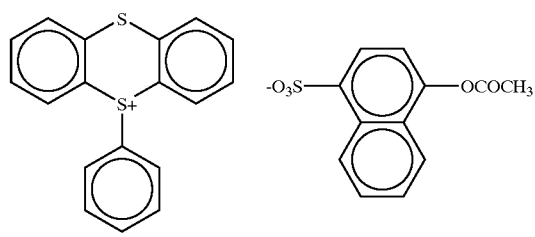
(I-11)
(I-12)
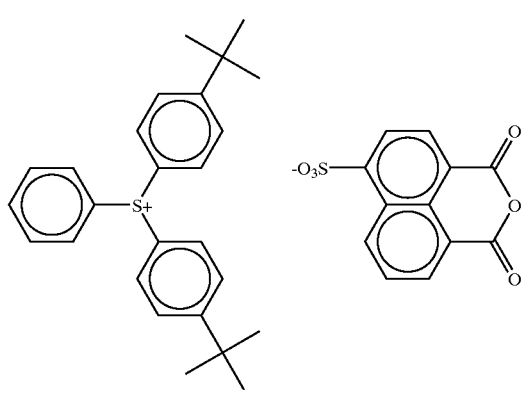
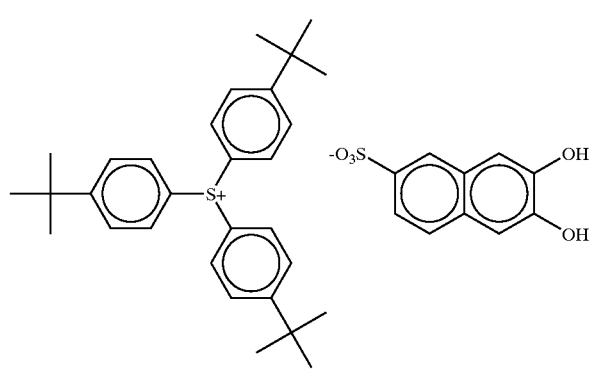
(I-13)
(I-14)
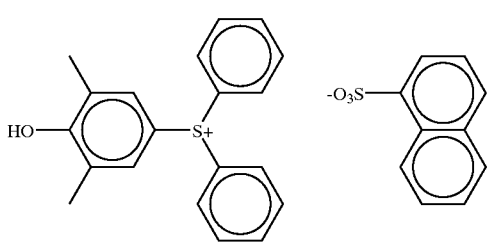
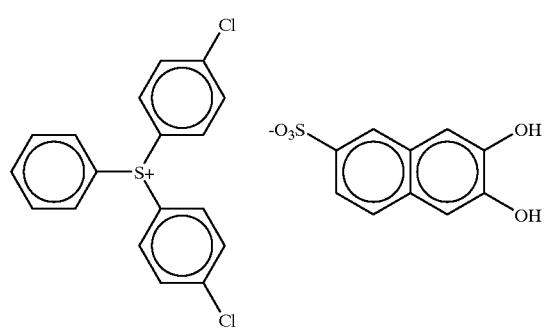
(II-1)
(II-2)
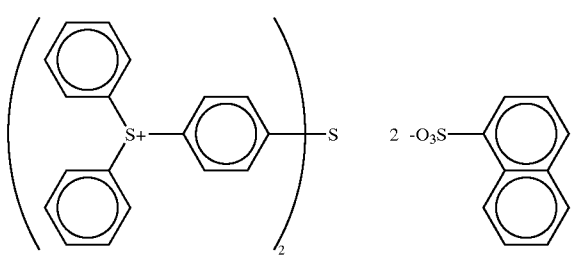
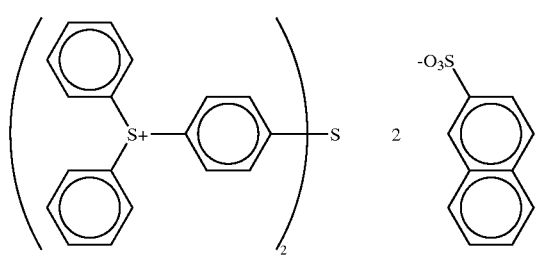

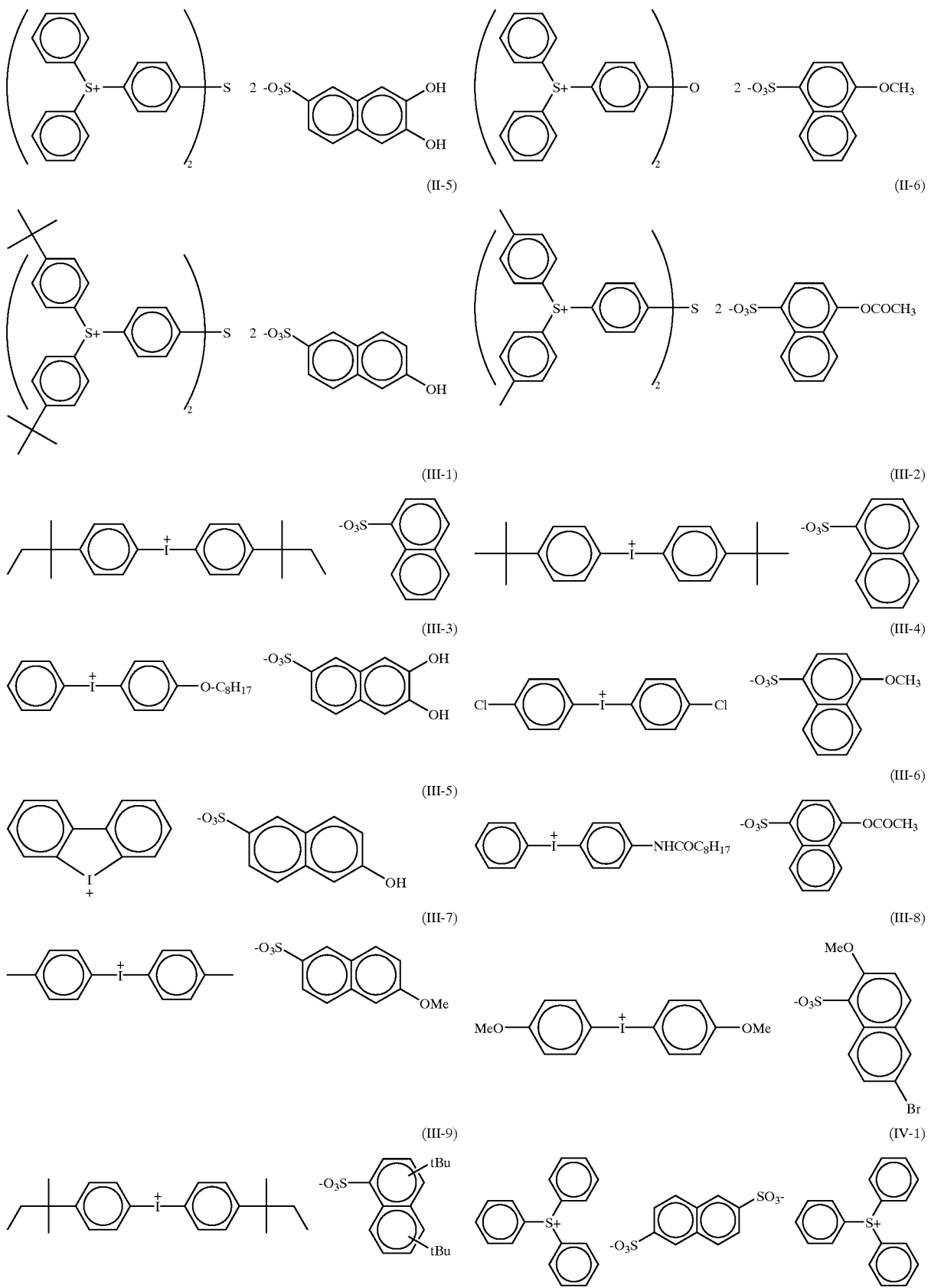

-continued
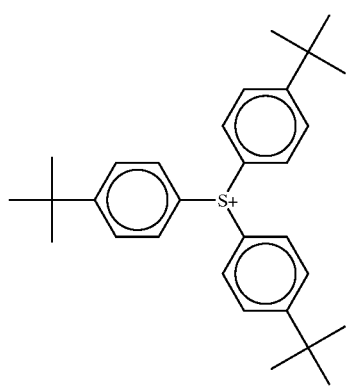 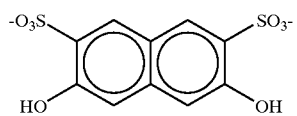 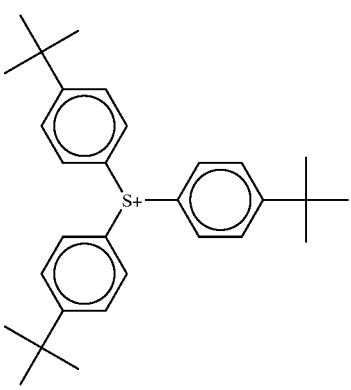
(IV-2)
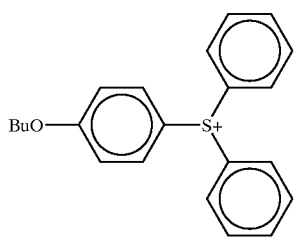 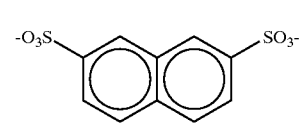 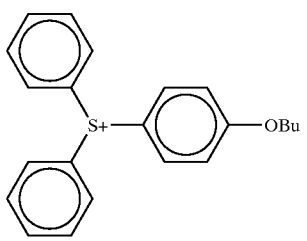
(IV-3)
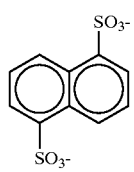 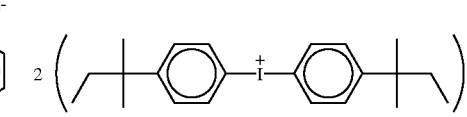
(IV-4)
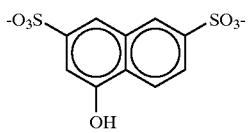 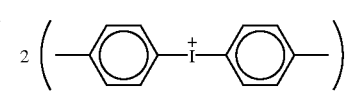
(IV-5)
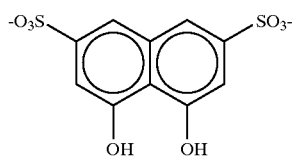 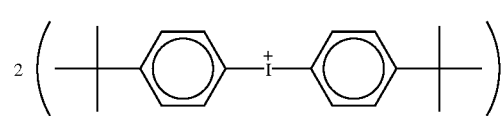
(IV-6)
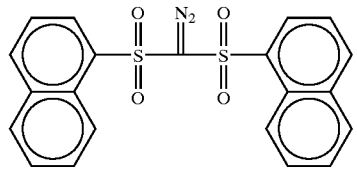
(V-1)
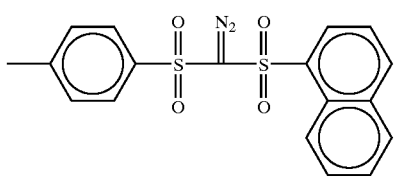
(V-2)
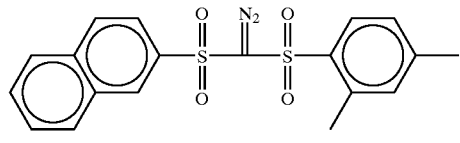
(V-3)
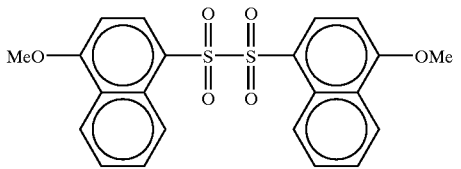
(V-4)
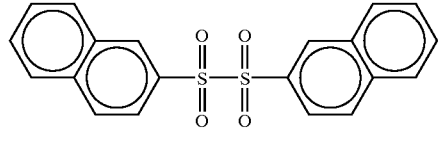
(V-5)
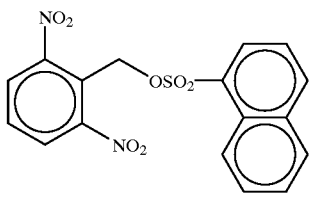
(V-6)

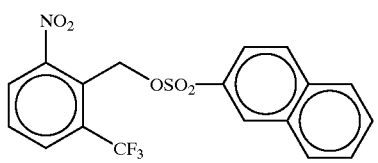 (V-6)

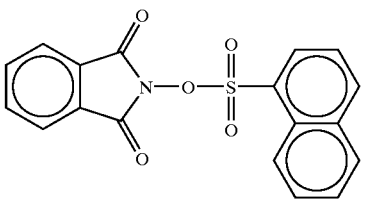 (V-7)

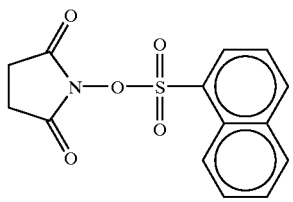 (V-8)

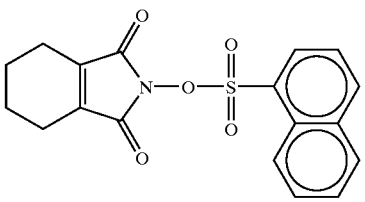 (V-9)

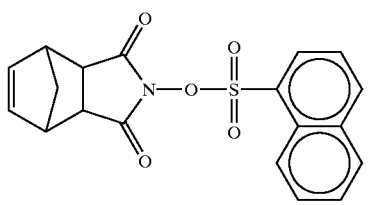 (V-10)

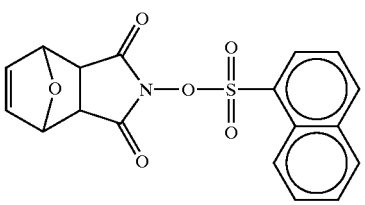 (V-11)

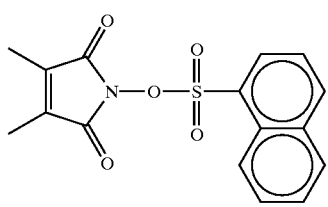 (V-12)

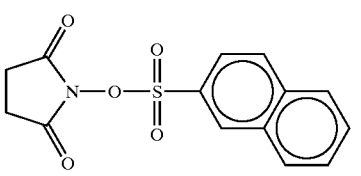 (V-13)

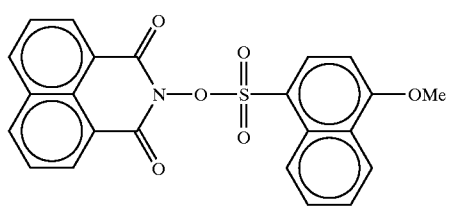 (V-14)

Of the above, (I-1), (I-2), (I-12), (I-13), (I-14), (II-1) (II-2), (II-3), (II-5), (III-1) and (III-2) are particularly preferred.

Other Photo Acid Generators

In addition to the above-described compounds which generate a sulfonic acid having naphthalene structure, other photo acid generators can be used in the present invention.

Photo acid generators can be appropriately selected from photo-cationic polymerization photo-initiators, photo-radical polymerization photo-initiators, photo-decolorants and photo-discolorants of dyes, and compounds which generate an acid by the irradiation with well-known rays used in microresists, etc., (e.g., ultraviolet rays of from 200 to 400 nm, far ultraviolet rays, particularly preferably, g-line, h-line, i-line, KrF eximer laser beams), ArF eximer laser beams, electron beams, X-rays, molecular beams or ion beams, and mixtures of these compounds.

In addition, as other compounds for use in the present invention which generate an acid by the irradiation with actinic rays or radiation, the following compounds can be exemplified, for example, diazonium salts described in S. I. Schlesinger, *Photogr. Sci. Eng.*, 18, 387 (1974), and T. S. Bal et al., *Polymer*, 21, 423 (1980); ammonium salts described in U.S. Pat. Nos. 4,069,055, 4,069,056, Re 27,992, and JP-A-3-140140; phosphonium salts described in D. C. Necker et al., *Macromolecules*, 17, 2468 (1984), C. S. Wen et al., *Teh. Proc. Conf. Rad. Curing ASIA*, p. 478, Tokyo, October (1988), U.S. Pat. Nos. 4,069,055 and 4,069,056; idonium salts described in J. V. Crivello et al., *Macromolecules*, 10 (6), 1307 (1977), *Chem. & Eng. News*, November 28, p. 31 (1988), European Patents Nos. 104143, 339049, and 410201, JP-A-2-150848, and JP-A-2-296514; sulfonium salts described in J. V. Crivello et al., *Polymer J.*, 17, 73 (1985), J. V. Crivello et al., *J. Ora. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivelloetal., *Macromolecules*, 14 (5), 1141 (1981), J. V. Crivello et al., *J. Polmer Sci.*, Polymer Chem. Ed., 17, 2877 (1979), European Patents Nos. 370693, 161811, 410201, 339049, 233567, 297443, and 297442, U.S. Pat. Nos. 3,902,114, 4,923,177, 4,760,013, 4,734,444, and 2,833,827, German Patents 2,904,626, 3,604,580, and 3,604,581, JP-A-7-28237 and JP-A-8-27102; selenonium salts described in J. V. Crivelloetal., *Macromolecules*, 10 (6), 1307 (1977), and J. V. Crivello et al., *J. Polymer Sci.*, Polymer Chem . Ed., 17, 1047 (1979); onium salts, such as arsonium salts, etc., described in C. S. Wen et al., *Teh, Proc. Conf. Rad. Curina ASIA*, p. 478, Tokyo, October (1988); organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metals/organic halogen compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; photo acid generators having an o-nitrobenzyl protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), F. M. Houlihan et al., *Macromolecules*, 21, 2001 (1988), EUROPEAN PATENTS Nos. 0290750, 046093, 156535, 271851, 0388343, U.S. Pat. Nos. 3,901,710, and 4,181,531, JP-A-60-198538, and JP-A-53-133022; compounds which generate a sulfonic acid by photolysis represented by iminosulfonate described in M. Tunooka et al., *Polymer Preprints. Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), EUROPEAN PATENTS Nos. 0199672, 84515, 044115, 618564, 0101122, U.S. Pat. Nos. 4,371,605, and 4,431,774, JP-A-64-18143, JP-A-2-245756, and JP-A-3-140109; disulfone compounds described in JP-A-61-166544 and JP-A-2-71270; and diazoketosulfone and diazodisulfone compounds described in JP-A-3-103854, JP-A-3-103856 and JP-A-4-210960.

Further, compounds having introduced these groups or compounds generating an acid by light into the polymer main chain or side chain can be used in the present invention, e.g., compounds described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., i J. Polymer Sci., Polymer Chem. Ed., 17, 3845 (1979), U.S. Pat. No. 3,849,137, German Patent 3,914, 407, JP-A-63-26653, JP-A-55-164824, JP-A-62-69263, JP-A-63-146038, JP-A-63-163452, JP-A-62-153853, and JP-A-63-146029.

Further, the compounds which generate an acid by light as described, e.g., in V. N. R. Pillai, *Synthesis*, (1), 1 (1980), A. Abadet al., *Tetrahedron Lett.*, (47) 4555 (1971), D. H. R. Barton et al., *J. Chem. Soc., (C)*, 329 (1970), U.S. Pat. No. 3,779,778 and EP No. 126712 can also be used in the present invention.

Of the above compounds which are decomposed by the irradiation with actinic rays or radiation and generate an acid, those particularly effectively used in the present invention are described below.

(1) An oxazole derivative substituted with a trihalomethyl group represented by the following formula (PAG1) or an S-triazine derivative represented by the following formula (PAG2):

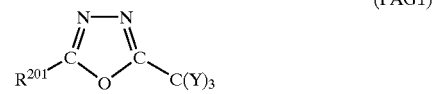

(PAG1)

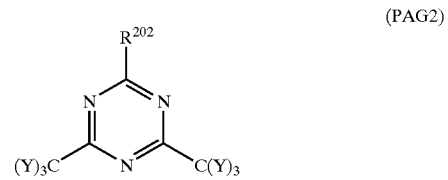

(PAG2)

wherein $R^{210}$ represents a substituted or unsubstituted aryl group or alkenyl group; $R^{202}$ represents a substituted or unsubstituted aryl group, alkenyl group, alkyl group, or —C(Y)$_3$; and Y represents a chlorine atom or a bromine atom.

Specific examples are shown below but the present invention is not limited thereto.

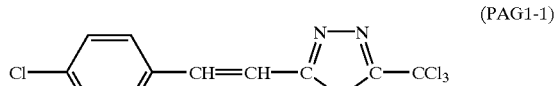

(PAG1-1)

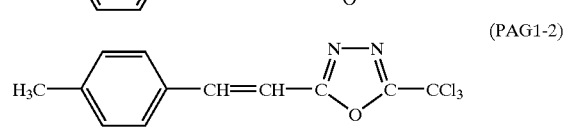

(PAG1-2)

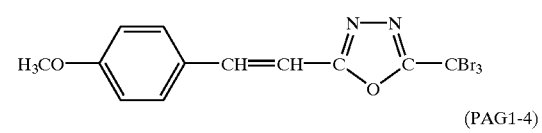

(PAG1-3)

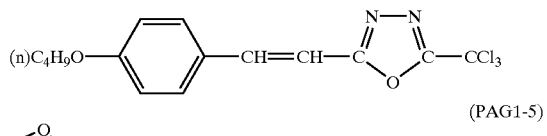

(PAG1-4)

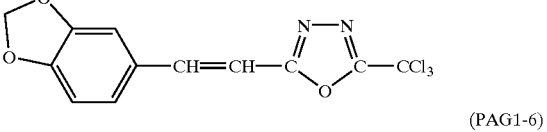

(PAG1-5)

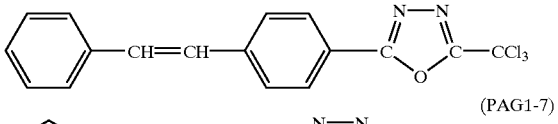

(PAG1-6)

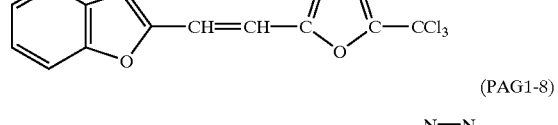

(PAG1-7)

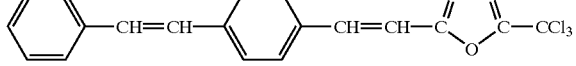

(PAG1-8)

-continued (PAG2-1) 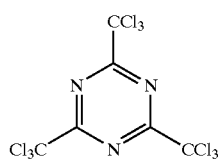

(PAG2-2) 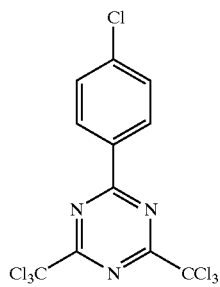

(PAG2-3) 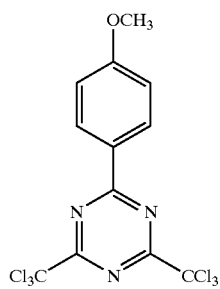

(PAG2-4) 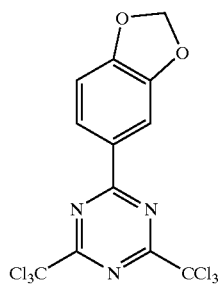

(PAG2-5) 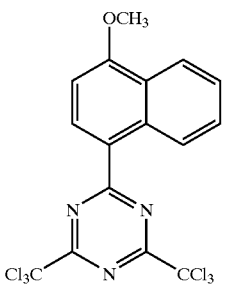

(PAG2-6) 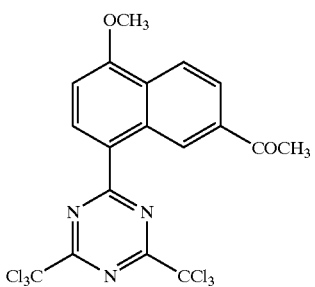

-continued (PAG2-7) 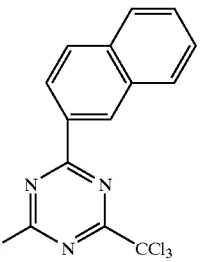

(PAG2-8) 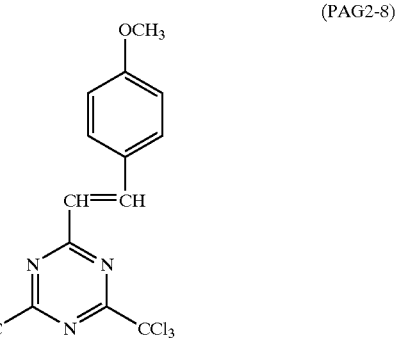

(2) An iodonium salt represented by the following formula (PAG3) or a sulfonium salt represented by the following formula (PAG4):

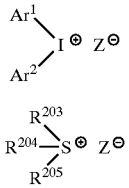
(PAG3)

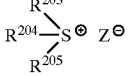
(PAG4)

wherein $Ar^1$ and $Ar^2$ each represents a substituted or unsubstituted aryl group. Examples of preferred substituents include an alkyl group, a haloalkyl group, a cycloalkyl group, an aryl group, an alkoxyl group, a nitro group, a carboxyl group, an alkoxycarbonyl group, a hydroxyl group, a mercapto group, and a halogen atom.

$R^{203}$, $R^{204}$ and $R^{205}$ each represents a substituted or unsubstituted alkyl group or aryl group, preferably an aryl group having from 6 to 14 carbon atoms, an alkyl group having from 1 to 8 carbon atoms, or substituted derivatives thereof. Examples of preferred substituents for the aryl group include an alkoxyl group having from 1 to 8 carbon atoms, an alkyl group having from 1 to 8 carbon atoms, a nitro group, a carboxyl group, a hydroxyl group and a halogen atom, and examples of preferred substituents for the alkyl group include an alkoxyl group having from 1 to 8 carbon atoms, a carboxyl group, and an alkoxycarbonyl group.

$Z^-$ represents a counter anion, e.g., a perfluoroalkanesulfonic acid anion such as $BF_4^-$, $AsF_6^-$, $PF6^-$, $SbF_6^-$, $SiF_6^{2-}$, $ClO_4^-$ and $CF_3SO_3^-$, a pentafluorobenzenesulfonic acid anion, a condensed polynuclear aromatic sulfonic acid anion such as a naphthalene-1-sulfonic acid anion, an anthraquinonesulfonic acid anion, or a sulfonic acid group-containing dye, but the present invention is not limited thereto.

Further two of $R^{203}$ and $R^{204}$, and $R^{205}$, and $Ar^1$ and $Ar^2$ may be bonded through respective single bonds or substituents.

Specific examples thereof are shown below but the present invention is not limited thereto.
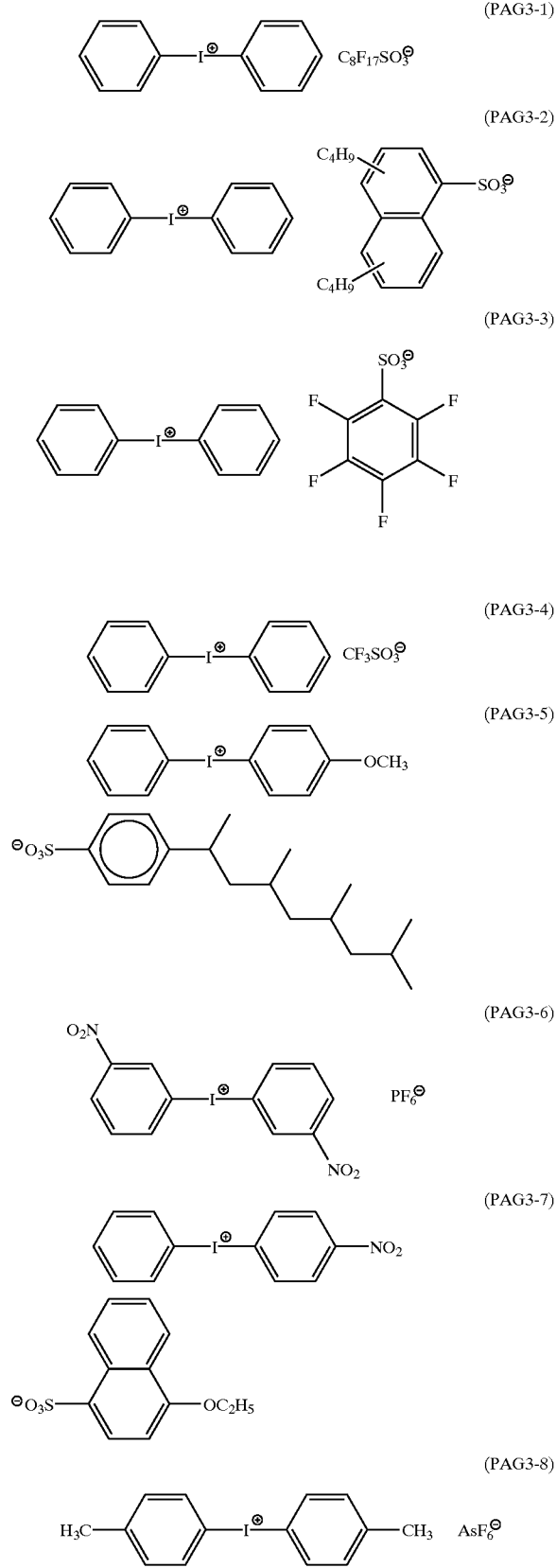
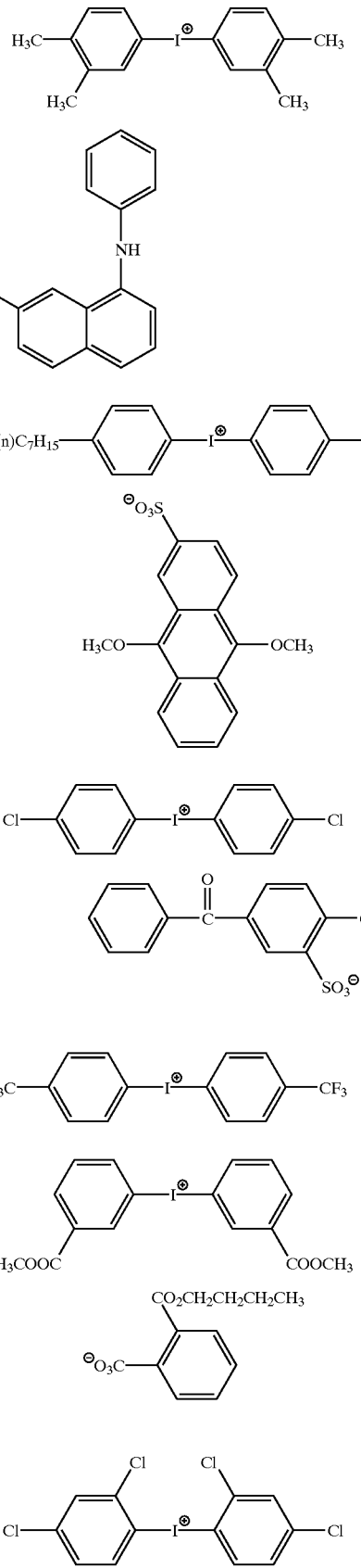

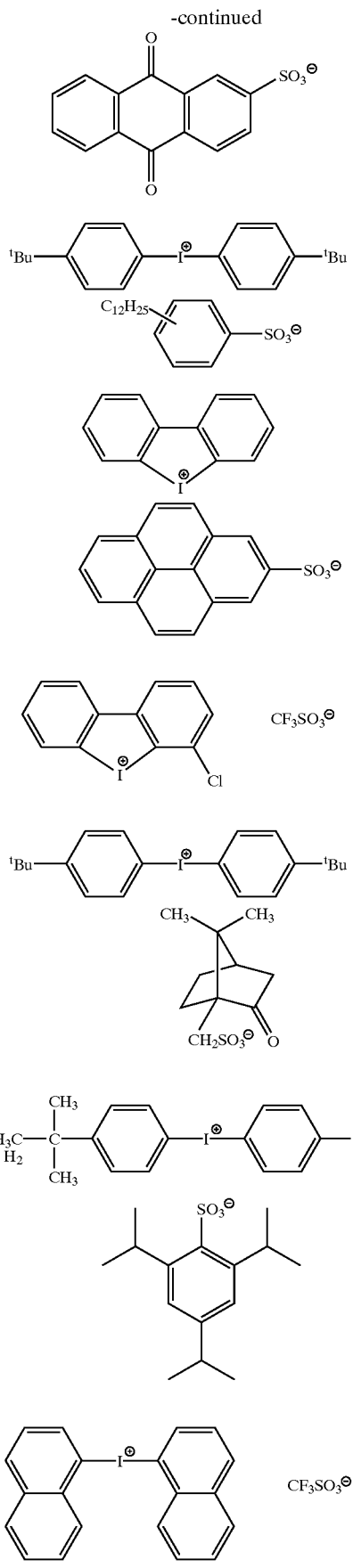
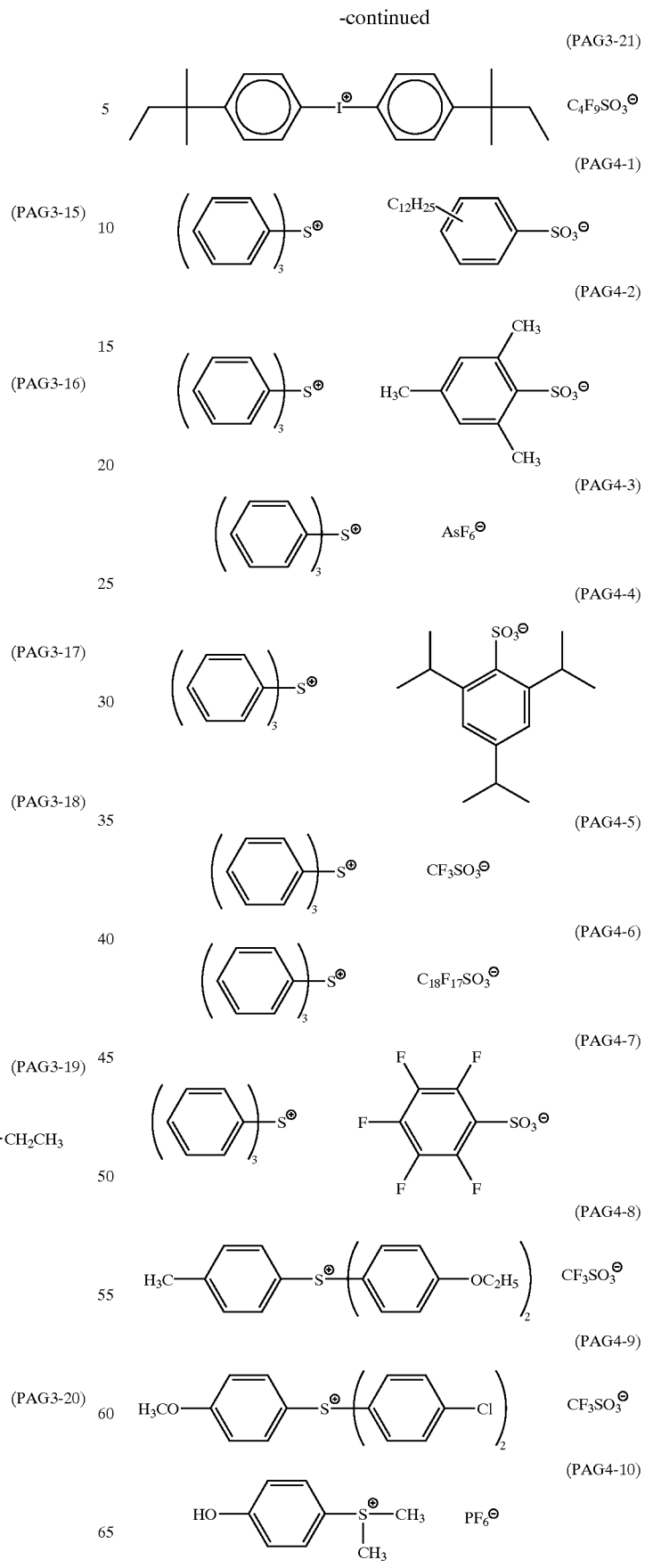

-continued (PAG4-11) ... (PAG4-19) [chemical structures]

(PAG4-20) ... (PAG4-28) [chemical structures]

-continued (PAG4-29)
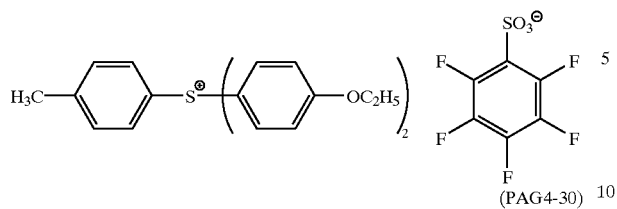

(PAG4-30)
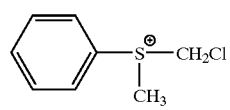

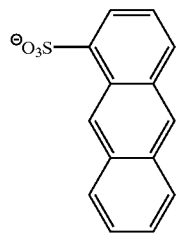

(PAG4-31)

(PAG4-32)

The above-described onium salts represented by formula (PAG3) or (PAG4) are well-known compounds and can be synthesized according to the methods described, e.g., in J. W. Knapczyk et al., *J. Am. Chem. Soc.*, 91, 145 (1969), A. L. Maycok et al., *J. Ora. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polymer Chem. Ed.*, 18, 2677 (1980), U.S. Pat. Nos. 2,807,648, 4,247,473, and JP-A-53-101331.

(3) A disulfone derivative represented by the following formula (PAG5) or an iminosulfonate derivative represented by the following formula (PAG6):

$$Ar^3—SO_2—SO_2—Ar^4 \quad \text{(PAG5)}$$

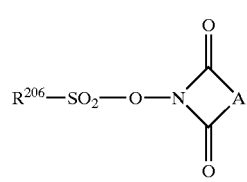

(PAG6)

wherein $Ar^3$ and $Ar^4$ each represents a substituted or unsubstituted aryl group; $R^{206}$ represents a substituted or unsubstituted alkyl group or aryl group; and A represents a substituted or unsubstituted alkylene group, alkenylene group, or arylene group.

Specific examples thereof are shown below but the present invention is not limited thereto.

(PAG5-1)
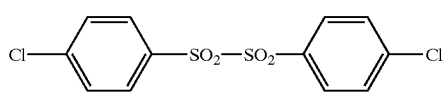

(PAG5-2)
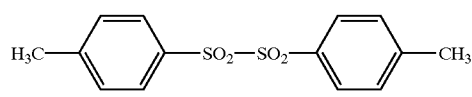

(PAG5-3)
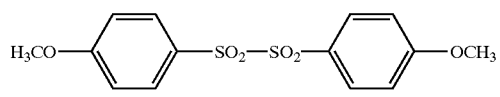

(PAG5-4)
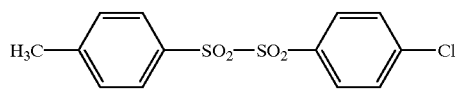

(PAG5-5)
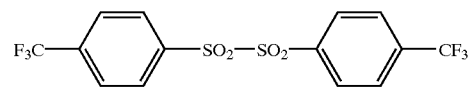

(PAG5-6)
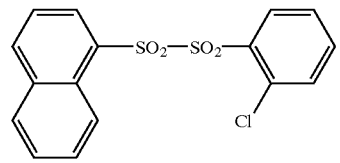

(PAG5-7)
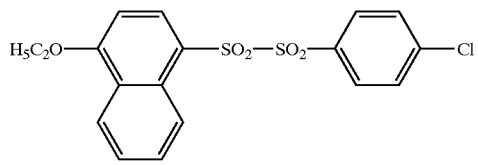

(PAG5-8)
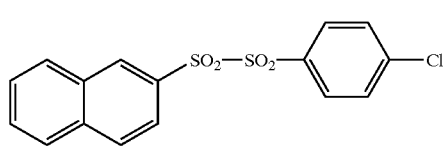

(PAG5-9)
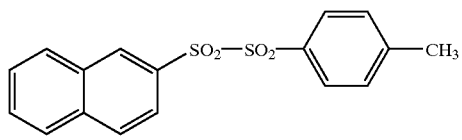

(PAG5-10)
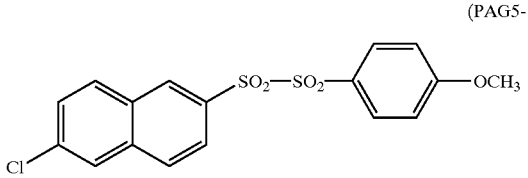

(PAG5-11)
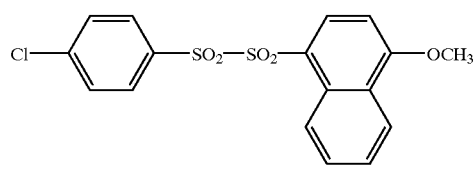
(PAG5-12)
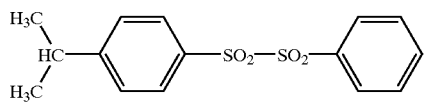
(PAG5-13)
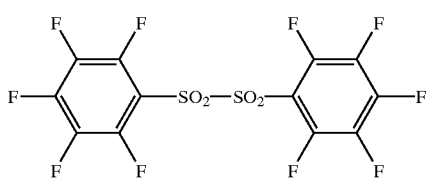
(PAG5-14)
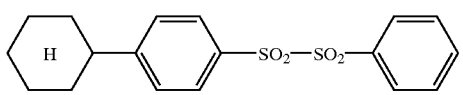
(PAG5-15)
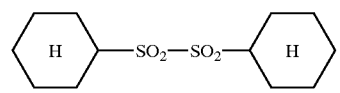
(PAG6-1)
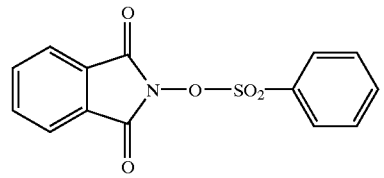
(PAG6-2)
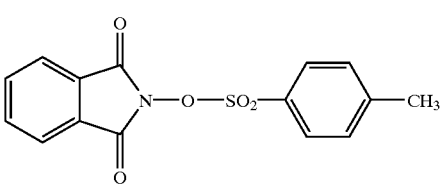
(PAG6-3)
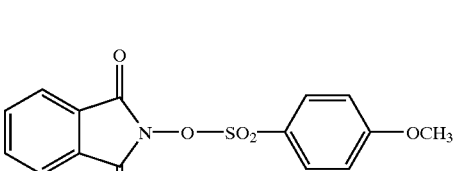
(PAG6-4)
(PAG6-5)
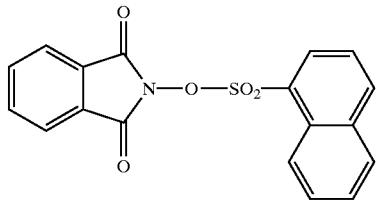
(PAG6-6)
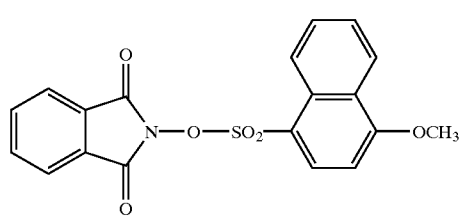
(PAG6-7)
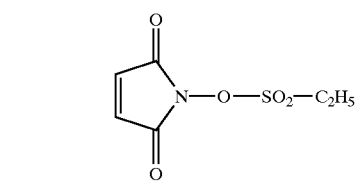
(PAG6-8)
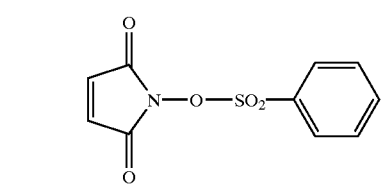
(PAG6-9)
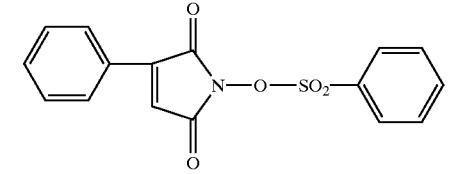
(PAG6-10)
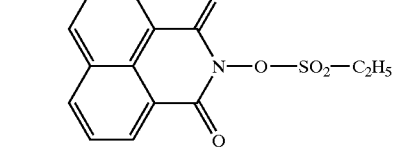
(PAG6-11)
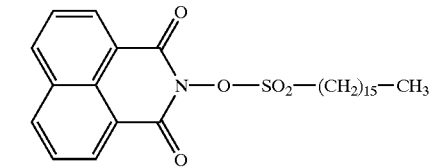
(PAG6-12)
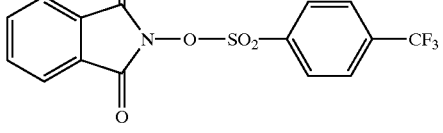

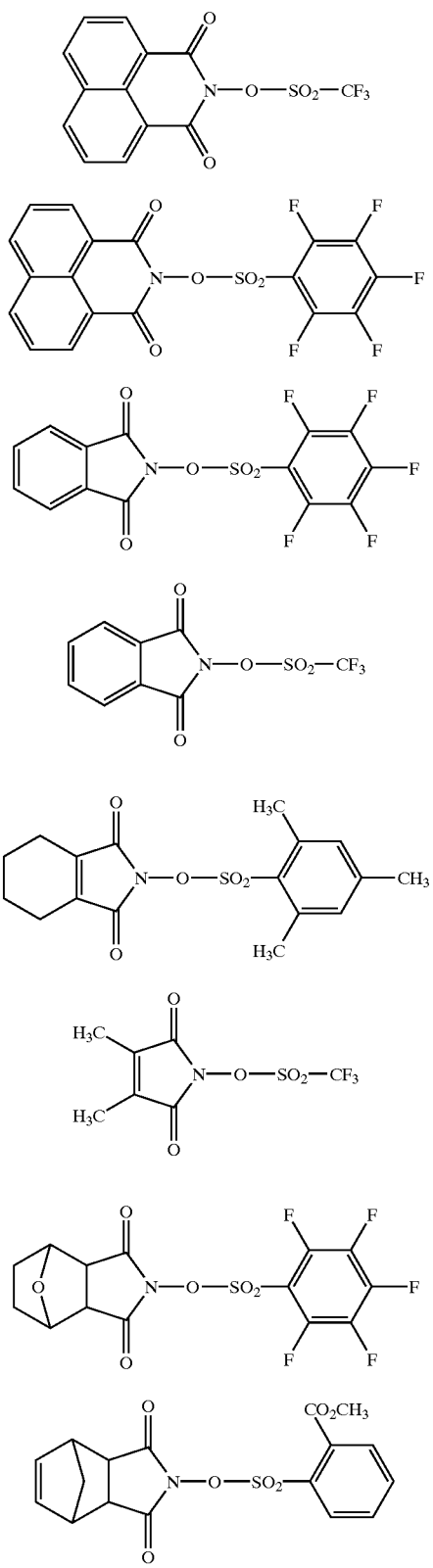

(4) A diazodisulfone derivative represented by the following formula (PAG7):

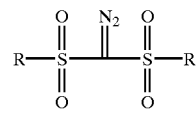

wherein R represents a straight chain, branched or cyclic alkyl group or an aryl group which may be substituted.

Specific examples thereof are shown below but the present invention is not limited thereto.

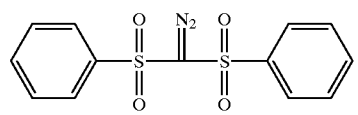

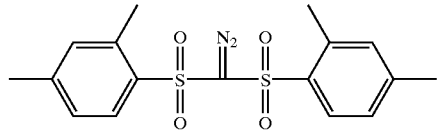

The addition amount of the compound of component (A) which is decomposed by the irradiation with actinic rays or radiation and generates a sulfonic acid having naphthalene structure is generally from 0.001 to 40% by weight, preferably from 0.01 to 20% by weight, and more preferably from 0.1 to 5% by weight, based on the solid content of the entire composition. Even if the addition amount of the compound of component (A) is increased more than the amount generally used, profile is not degraded and sensitivity and resolution are markedly improved. The above-described photo acid generators usable in combination with the compound of component (A) are used in an amount of generally 50 wt % or less, preferably 30 wt % or less, based on the entire use amount of the photo acid generator (by weight).

Acid-decomposable Resins

In the present invention, the resin whose solubility in an alkali developing solution increases by the action of an acid (also called "an acid-decomposable resin") is a resin having a group which is decomposed by the action of an acid.

The group which is decomposed by the action of an acid (also called "an acid-decomposable group") is, e.g., a group which is hydrolyzed by the action of an acid and generates an acid or a group whose carbon cation is desorbed by the action of an acid and generates an acid, preferably a group represented by the following formula (x) or (y), an acid-decomposable group containing lactone structure, or an acid-decomposable group containing alicyclic structure, which group contributes to excellent aging stability.

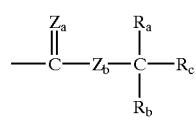

-continued

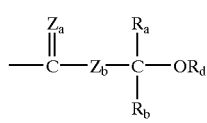
(y)

wherein $R_a$, $R_b$ and $R_c$, which may be the same or different, each represents a hydrogen atom, or an alkyl, cycloalkyl or alkenyl group each of which may have a substituent, provided that at least one of $R_a$, $R_b$ and $R_c$ in formula (x) represents a group other than a hydrogen atom. $R_d$ represents an alkyl, cycloalkyl or alkenyl group each of which may have a substituent. Further, two groups of $R_a$, $R_b$ and $R_c$ in formula (x) or two groups of $R_a$, $R_b$ and $R_d$ in formula (y) may be bonded to form a cyclic structure comprising from 3 to 8 carbon atoms and hetero atoms. Specific examples of such rings include a cyclopropyl group, a cyclopentyl group, a cyclohexyl group, a cycloheptyl group, a 1-cyclohexenyl group, a 2-tetrahydrofuranyl group, and a 2-tetrahydropyranyl group.

$Z_a$ and $Z_b$, which may be the same or different, each represents an oxygen atom or a sulfur atom.

The alkyl group represented by $R_a$, $R_b$, $R_c$ and $R_d$ is preferably a methyl group, an ethyl group, a propyl group, an n-butyl group, a sec-butyl group, a hexyl group, a 2-ethylhexyl group or an octyl group each of which may have a substituent and have from 1 to 8 carbon atoms. The cycloalkyl group is preferably a cyclopropyl group, a cyclopentyl group, or a cyclohexyl group each of which may have a substituent and have from 3 to 8 carbon atoms. The alkenyl group is preferably a vinyl group, a propenyl group, an allyl group, a butenyl group, a pentenyl group, a hexenyl group, or a cyclohexenyl group each of which may have a substituent and have from 2 to 6 carbon atoms.

As further substituents of the above each substituent described in detail, preferably a hydroxyl group, a halogen atom (e.g., fluorine, chlorine, bromine, iodine), a nitro group, a cyano group, an amido group, a sulfonamido group, an alkyl group, e.g., a methyl group, an ethyl group, a propyl group, an n-butyl group, a sec-butyl group, a hexyl group, a 2-ethylhexyl group and an octyl group, an alkoxyl group, e.g., a methoxy group, an ethoxy group, a hydroxyethoxy group, a propoxy group, a hydroxypropoxy group and a butoxy group, an alkoxycarbonyl group, e.g., a methoxycarbonyl group and an ethoxycarbonyl group, an acyl group, e.g., a formyl group, an acetyl group and a benzoyl group, an acyloxy group, e.g., an acetoxy group and a butyryloxy group, and a carboxyl group can be exemplified.

Specific examples of the repeating units having an acid-decomposable group are shown below but it should not be construed as the present invention is limited thereto.

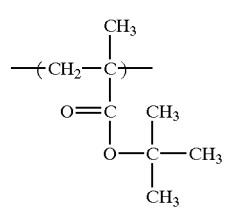
(c1)

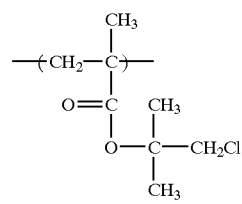
(c2)

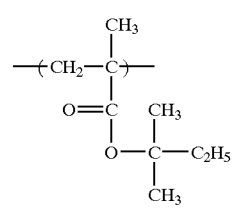
(c3)

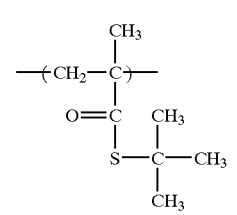
(c4)

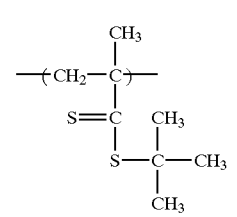
(c5)

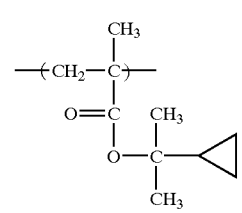
(c6)

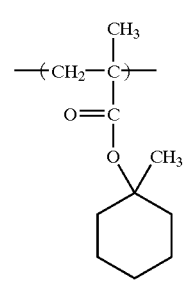
(c7)

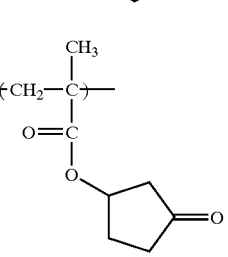
(c8)

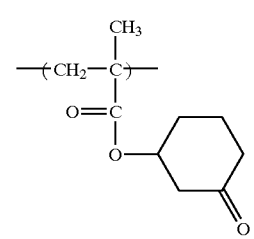 (c9)
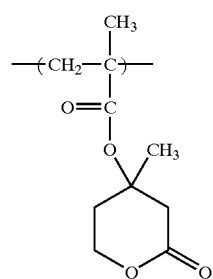 (c10)
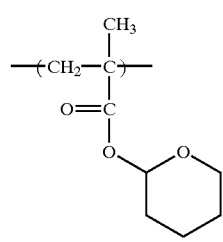 (c11)
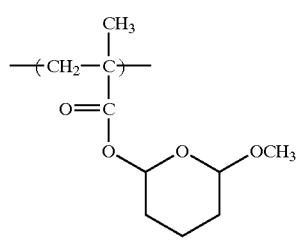 (c12)
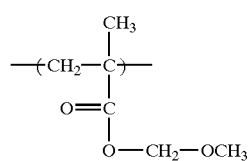 (c13)
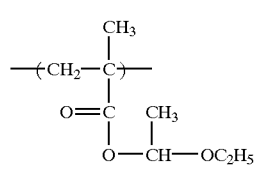 (c14)
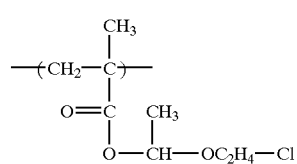 (c15)
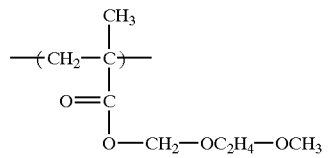 (c16)
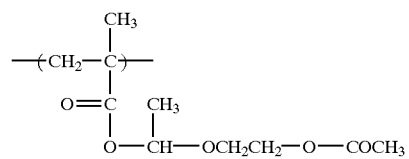 (c17)
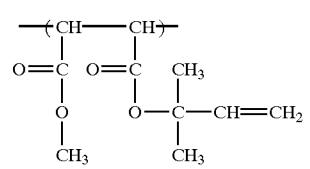 (c18)
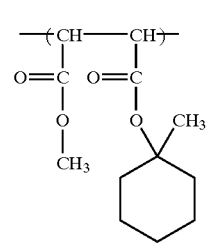 (c19)
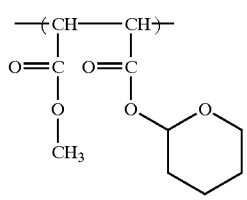 (c20)
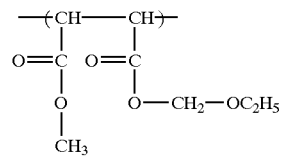 (c21)
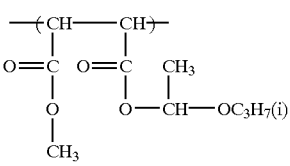 (c22)
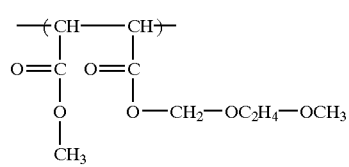 (c23)

(c24)

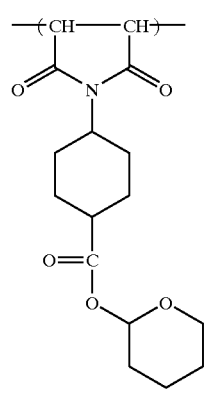

Of the above formulae, (c1), (c7) and (c11) are particularly excellent in acid decomposability.

In the present invention, it is preferred that monocyclic or polycyclic alicyclic hydrocarbon structure and/or lactone structure are(is) contained in the acid-decomposable resins. The acid-decomposable resins preferably have lactone structure at the side chain, specifically the repeating units (a1) to (a20) having lactone structure at the side chain as shown below can be exemplified. The alicyclic hydrocarbon structure and the lactone structure in the present invention may be or may not necessarily be acid-decomposable.

The acid-decomposable groups which may be contained in the alicyclic hydrocarbon group may be connected by acid-decomposable structure, decomposed by the action of an acid and the alicyclic hydrocarbon group may be desorbed, or the above-described group represented by formula (x) or (y) may be bonded to the alicyclic hydrocarbon group directly or via a linking group.

When the acid-decomposable resins have a monocyclic or polycyclic alicyclic hydrocarbon group at the side chain, it is preferred that the main chain of the resin and the alicyclic hydrocarbon group are connected by a tertiary ester group.

(a1)

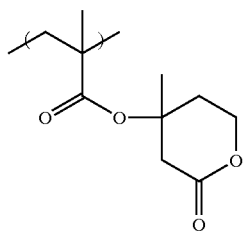

(a2)

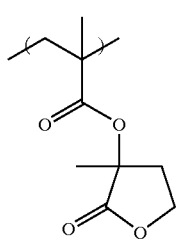

(a3)

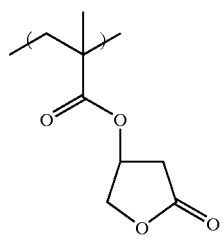

(a4)

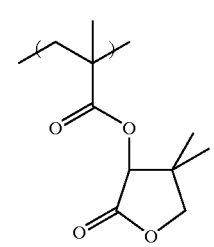

(a5)

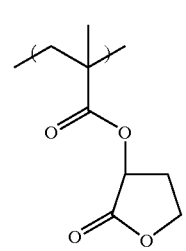

(a6)

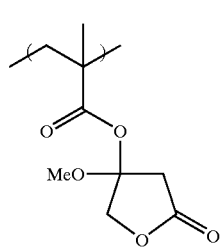

(a7)

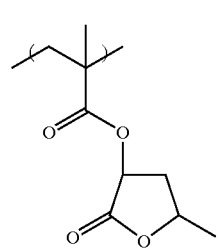

(a8)

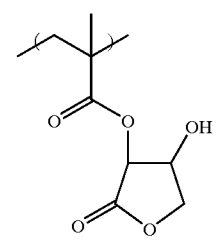

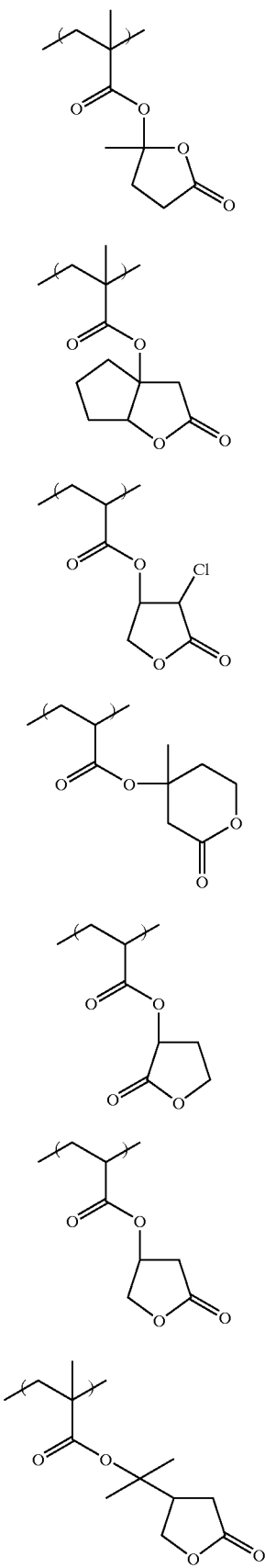
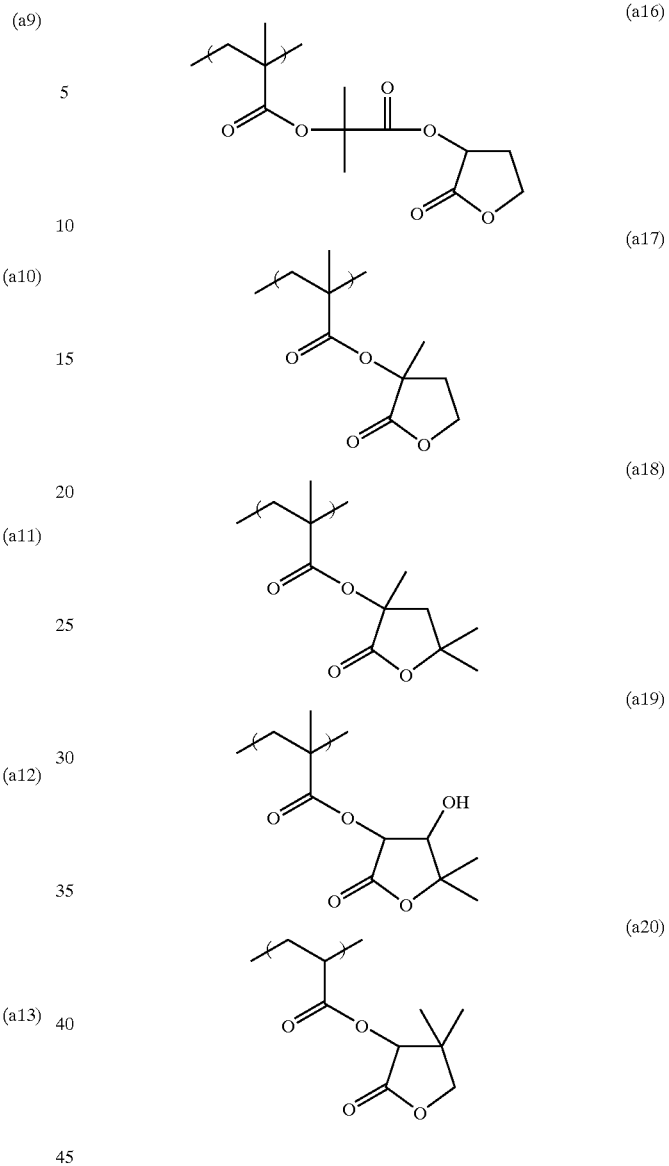

Of the above-exemplified (a1) to (a20), (a1), (a12) and (a15) are preferred for their acid decomposability.

As the monocyclic alicyclic hydrocarbon structures contained in the acid-decomposable resins, groups having monocyclic alicyclic skeletons having 3 or more, preferably from 3 to 8, carbon atoms, e.g., cyclic hydrocarbon skeletons such as cyclopropane, cyclobutane, cyclopentane, cyclohexane, etc., can be exemplified. As the polycyclic alicyclic hydrocarbon structures, groups having polycyclic alicyclic skeletons having 5 or more, preferably from 7 to 25, carbon atoms, e.g., bicyclo-, tricyclo- and tetracyclo-alicyclic hydrocarbon skeletons can be exemplified. Specific examples of the structures are shown below.

The repeating units having these monocyclic or polycyclic alicyclic hydrocarbon structures are preferably the structural units represented by the following formula (II), (III), (IV) or (V).

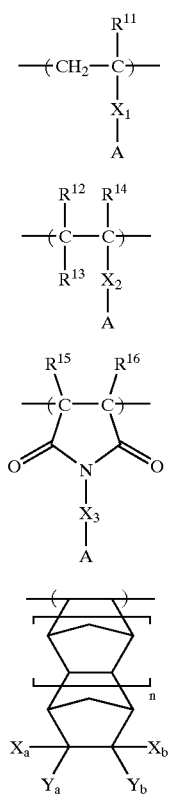

(II)

(III)

(IV)

(V)

Formulae (II), (III) and (IV), and successively formula (V) will be described below.

In formulae (II), (III) and (IV), the substituents substituted on the main chains of the repeating units, i.e., $R^{11}$, $R^{12}$, $R^{14}$, $R^{15}$ and $R^{16}$, each represents a hydrogen atom, a halogen atom, a cyano group, an alkyl group, or a haloalkyl group. $R^{11}$, $R^{12}$, $R^{14}$, $R^{15}$ and $R^{16}$ may be the same with or different from each other.

As the alkyl group represented by $R^{11}$, $R^{12}$, $R^{14}$, $R^{15}$ or $R^{16}$, a hydrocarbon group having from 1 to 4 carbon atoms, e.g., a methyl group, an ethyl group, a propyl group, an n-butyl group, and a sec-butyl group can be exemplified. As the haloalkyl group, groups whose alkyl group having from 1 to 4 carbon atoms is partially or entirely substituted with a halogen atom can be exemplified, and as the halogen atom, a fluorine atom, a chlorine atom or a bromine atom can be exemplified. For example, a fluoromethyl group, a chloromethyl group, a bromomethyl group, a fluoroethyl group, a chloroethyl group and a bromoethyl group can be exemplified as the haloalkyl group. These alkyl groups and haloalkyl groups may further have a substituent other than a halogen atom.

Substituent $R^3$ represents a cyano group, $-CO-OR^{23}$ or $-CO-NR^{24}R^{25}$. $R^{23}$ represents a hydrogen atom, an alkyl group, a cycloalkyl group, an alkenyl group, or an acid-decomposable group comprehensively. As the acid-decomposable group, the same groups as described above can be exemplified. For example, the compounds having the same repeating unit as above are preferred. The alkyl group, the cycloalkyl group, and the alkenyl group represented by $R^{23}$ may further have a substituent.

$R^{24}$ and $R^{25}$ each represents a hydrogen atom, an alkyl group, a cycloalkyl group or an alkenyl group. The alkyl group, the cycloalkyl group and the alkenyl group may further have a substituent. $R^{24}$ and $R^{25}$ may be the same with or different from each other, or may be bonded to each other to form a ring together with a nitrogen atom, preferably a 5- to 8-membered ring. Specifically, pyrrolidine, piperidine and piperazine skeletons can be exemplified.

As the preferred alkyl groups represented by $R^{23}$, $R^{24}$ and $R^{25}$, an alkyl group having from 1 to 8 carbon atoms, e.g., a methyl group, an ethyl group, a propyl group, an n-butyl group, a sec-butyl group, a hexyl group, a 2-ethylhexyl group, and an octyl group can be exemplified. As the preferred cycloalkyl groups, a cycloalkyl group having from 3 to 8 carbon atoms, e.g., a cyclopropyl group, a cyclopentyl group, and a cyclohexyl group can be exemplified. As the preferred alkenyl groups, an alkenyl group having from 2 to 6 carbon atoms, e.g., a vinyl group, a propenyl group, an allyl group, a butenyl group, a pentenyl group, a hexenyl group, and a cyclohexenyl group can be exemplified.

The alkyl, cycloalkyl and alkenyl groups each may have a substituent.

Of the substituents constituted by $X_1-A$, $X_2-A$ and $X_3-A$, $X_1$, $X_2$ and $X_3$ are each a general term for a single bond and a divalent group, which represents, e.g., an alkylene group, an alkenylene group, a cycloalkylene group, $-O-$, $-SO_2-$, $-O-CO-R^{26}-$, $-CO-O-R^{27}-$, or $-CO-NR^{28}-R^{29}-$. $X_1$, $X_2$ and $X_3$ may be the same with or different from each other.

Of $X_1$, $X_2$ and $X_3$, the divalent groups having the same carbon skeletons as the alkyl, alkenyl and cycloalkyl groups represented by $R^{11}$, $R^{12}$, $R^{14}$, $R^{15}$ or $R^{16}$ can be exemplified as the alkylene, alkenylene and cycloalkylene groups.

$R^{26}$, $R^{27}$ and $R^{29}$ in $-O-CO-R^{26}-$, or $-CO-O-R^{27}-$ and $-CO-NR^{28}-R^{29}-$ represented by $X_1$, $X_2$ or $X_3$ are each a general term for a single bond and a divalent group. As the divalent group in this case, e.g., an alkylene group, an alkenylene group, and a cycloalkylene group can be exemplified. The divalent groups having the same carbon skeletons as the alkyl, alkenyl and cycloalkyl groups represented by $R^{11}$, $R^{12}$, $R^{14}$, $R^{15}$ or $R^{16}$ can be exemplified as the alkylene, alkenylene and cycloalkylene groups. These groups may further be directly bonded to an ether group, an ester group, an amido group, a urethane group or a ureido group to form a divalent group. $R^{26}$, $R^{27}$ and $R^{29}$ may be the same with or different from each other.

Of $X_1$, $X_2$ and $X_3$, $R^{28}$ in the substituent represented by $-NR^{28}-$ represents a hydrogen atom, an alkyl group, a cycloalkyl group or an alkenyl group similarly to $R^{23}$, $R^{24}$ and $R^{25}$. The alkyl, cycloalkyl and alkenyl groups may have a substituent. $R^{28}$ may be the same with or different from any of $R^{24}$ and $R^{25}$. The alkyl, cycloalkyl or alkenyl group has the same meaning as the alkyl, cycloalkyl or alkenyl group represented by $R^{23}$, $R^{24}$ and $R^{25}$.

Substituent A bonded indirectly to the main chain of the repeating unit through $X_1$ and the like represents a monocyclic or polycyclic hydrocarbon group comprehensively. As the monocyclic hydrocarbon groups represented by A, groups having alicyclic skeletons having 3 or more, preferably from 3 to 8, carbon atoms, e.g., cyclic hydrocarbon skeletons such as cyclopropane, cyclobutane, cyclopentane, cyclohexane, etc., can be exemplified. As the polycyclic hydrocarbon groups, groups having alicyclic skeletons having 5 or more, preferably from 7 to 25, carbon atoms, e.g., bicyclo-, tricyclo- and tetracyclo-alicyclic hydrocarbon skeletons can be exemplified. These monocyclic or polycyclic hydrocarbon skeleton groups may further have a substituent to increase the number of carbon atoms.

Preferred examples of the substituents of the polycyclic alicyclic group include a hydroxyl group, a halogen atom, a nitro group, a cyano group, an amido group, a sulfonamido group, and the groups described above in the alkyl group represented by $R^{23}$. The halogen atom is a fluorine atom, a chlorine atom, a bromine atom or an iodine atom. Besides the alkyl group, an alkoxyl group, an alkoxycarbonyl group, an acyl group, an acyloxy group and a carboxyl group can be exemplified. As the alkoxyl group, an alkoxyl group having from 1 to 8 carbon atoms, e.g., a methoxy group, an ethoxy group, a hydroxyethoxy group, a propoxy group, a hydroxypropoxy group, and a butoxy group can be exemplified. As the alkoxycarbonyl group, an alkoxycarbonyl group such as a methoxycarbonyl group and an ethoxycarbonyl group can be exemplified. As the acyl group, a formyl group, an acetyl group, and a benzoyl group can be exemplified. As the acyloxy group, an acetoxy group and a butyryloxy group can be exemplified.

In the above formula (V), $X_a$ and $X_b$ each represents a hydrogen atom or an alkyl group having from 1 to 4 carbon atoms.

$Y_a$ and $Y_b$ each represents a hydrogen atom, a hydroxyl group, or a group capable of being represented by —COOX$_c$, wherein X$_c$ represents a hydrogen atom or an alkyl group. As the alkyl group, an alkyl group having from 1 to 8, preferably from 1 to 4, carbon atoms, e.g., a methyl group, an ethyl group, a propyl group, a butyl group and a tert-butyl group can be exemplified. A hydroxyl group, a halogen group or a cyano group may be substituted partially or entirely on the hydrogen atoms of these alkyl groups.

In addition, a group in which —COOX$_c$ at large constitutes an acid-decomposable group can be exemplified as X$_c$. Specifically, a group represented by the above formula (x) or (y) can be exemplified. Besides the above, a group containing acid-decomposable lactone structure and a group containing acid-decomposable alicyclic structure can also be exemplified.

As the structures of the polycyclic or monocyclic alicyclic moieties of the above polycyclic or monocyclic hydrocarbon groups, i.e., the representative structure represented by A, the following compounds can be exemplified for instance.

(1)

(2) 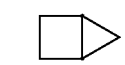

(3) 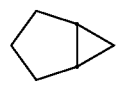

(4) 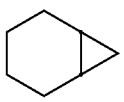

(5) 

(6) 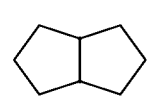

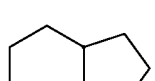

-continued (7) 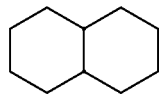

(8) 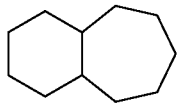

(9) 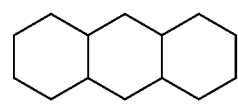

(10) 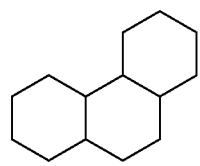

(11) 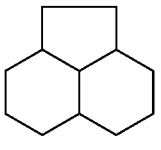

(12) 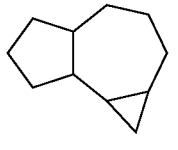

(13) 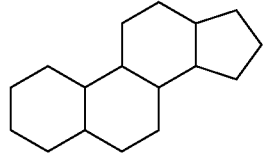

(14) 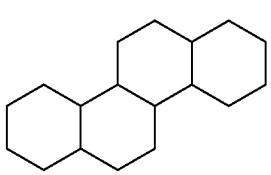

(15) 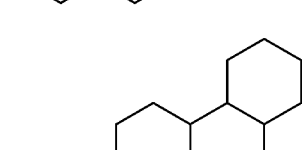

(16) 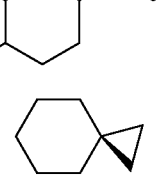

(17) 

-continued
(18)
(19)
(20)
(21)
(22)
(23)
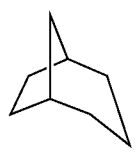
(24)
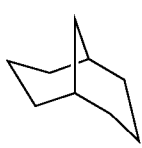
(25)
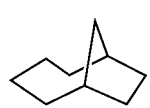
(26)
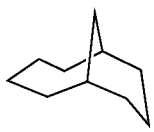
(27)
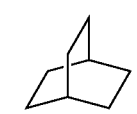
(28)
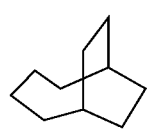
(29)
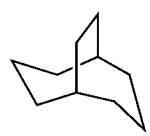
(30)
-continued
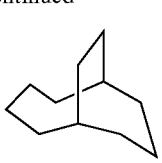
(31)
(32)
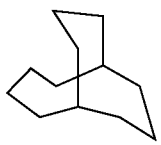
(33)
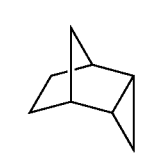
(34)
(35)
(36)
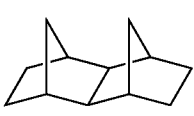
(37)
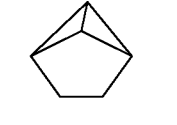
(38)
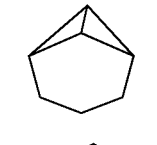
(39)
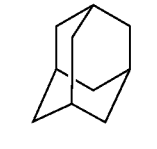
(40)
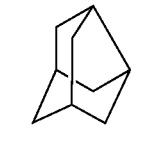
(41)
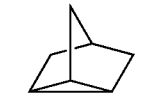
(42)

(43) 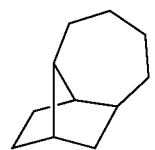
(44) 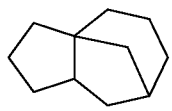
(45) 
(46) 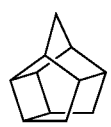
(47) 
(48) 
(49) 
(50) 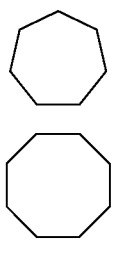
The specific examples of the repeating units represented by formula (II), (III) or (IV) are shown below but it should not be construed as the present invention is limited thereto.
(b1) 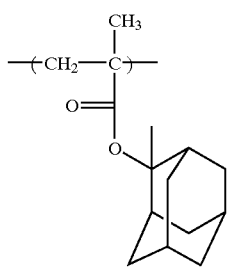
(b2) 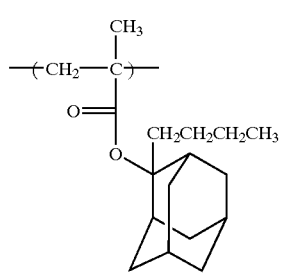
(b3) 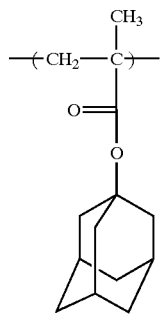
(b4) 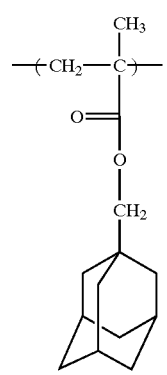
(b5) 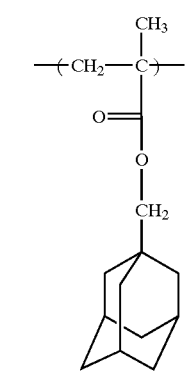
(b6) 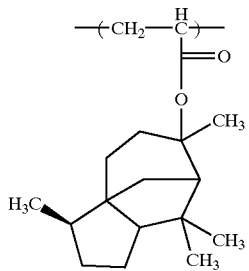
(b7) 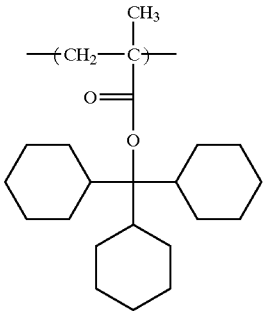

(b8) 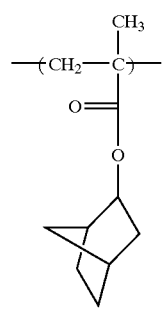
(b9) 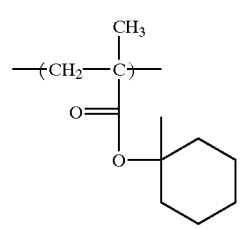
(b10) 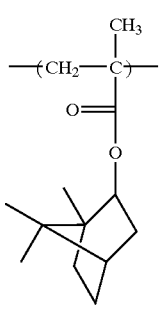
(b11) 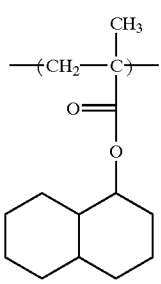
(b12) 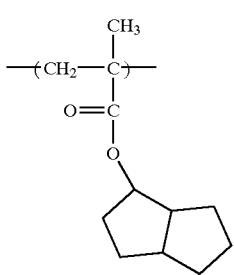
(b13) 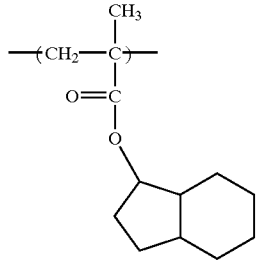
(b14) 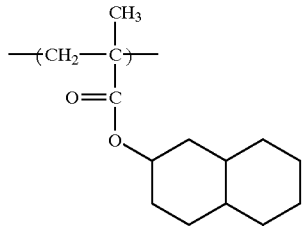
(b15) 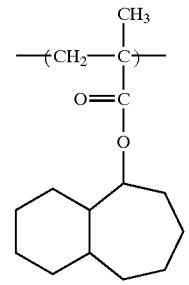
(b16) 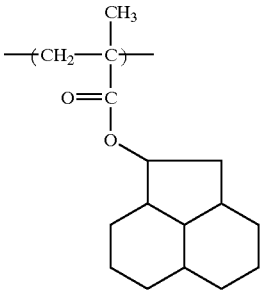
(b17) 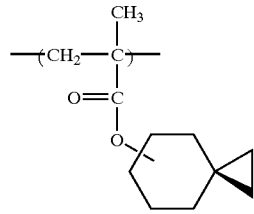
(b18) 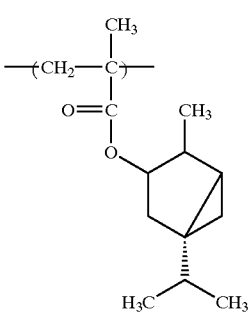

(b19)
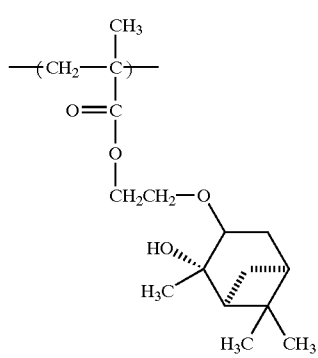
(b20)
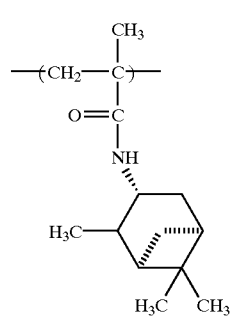
(b21)
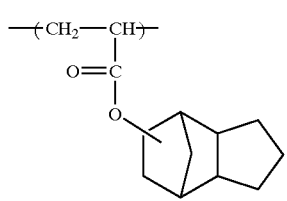
(b22)
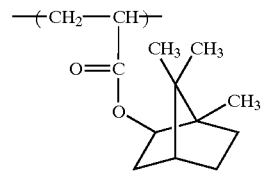
(b23)
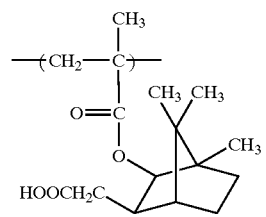
(b24)
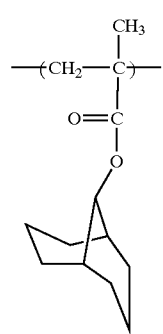
(b25)
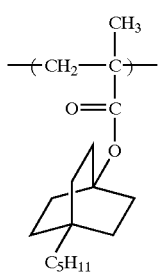
(b26)
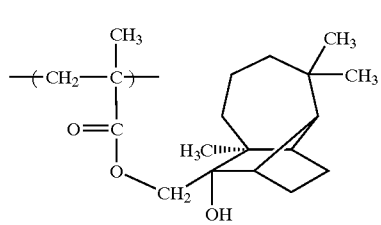
(b27)
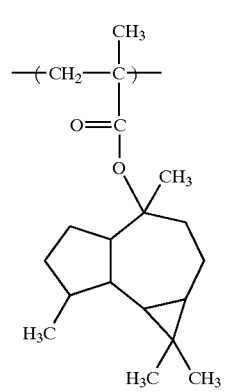
(b28)
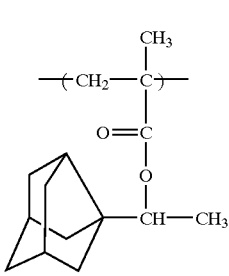
(b29)
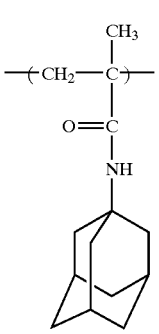

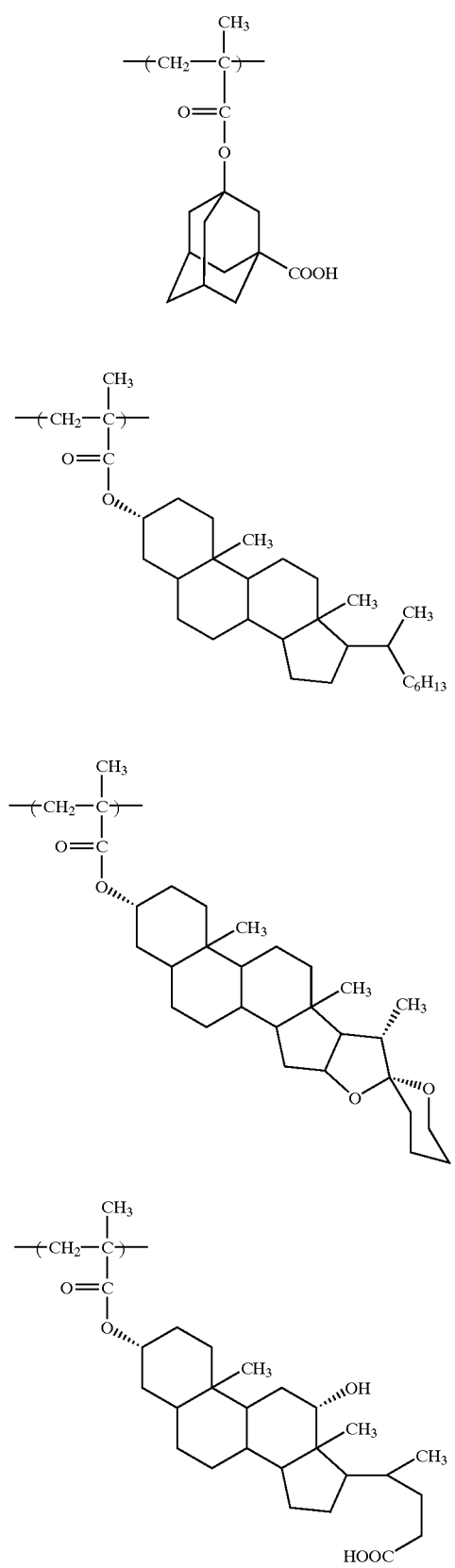
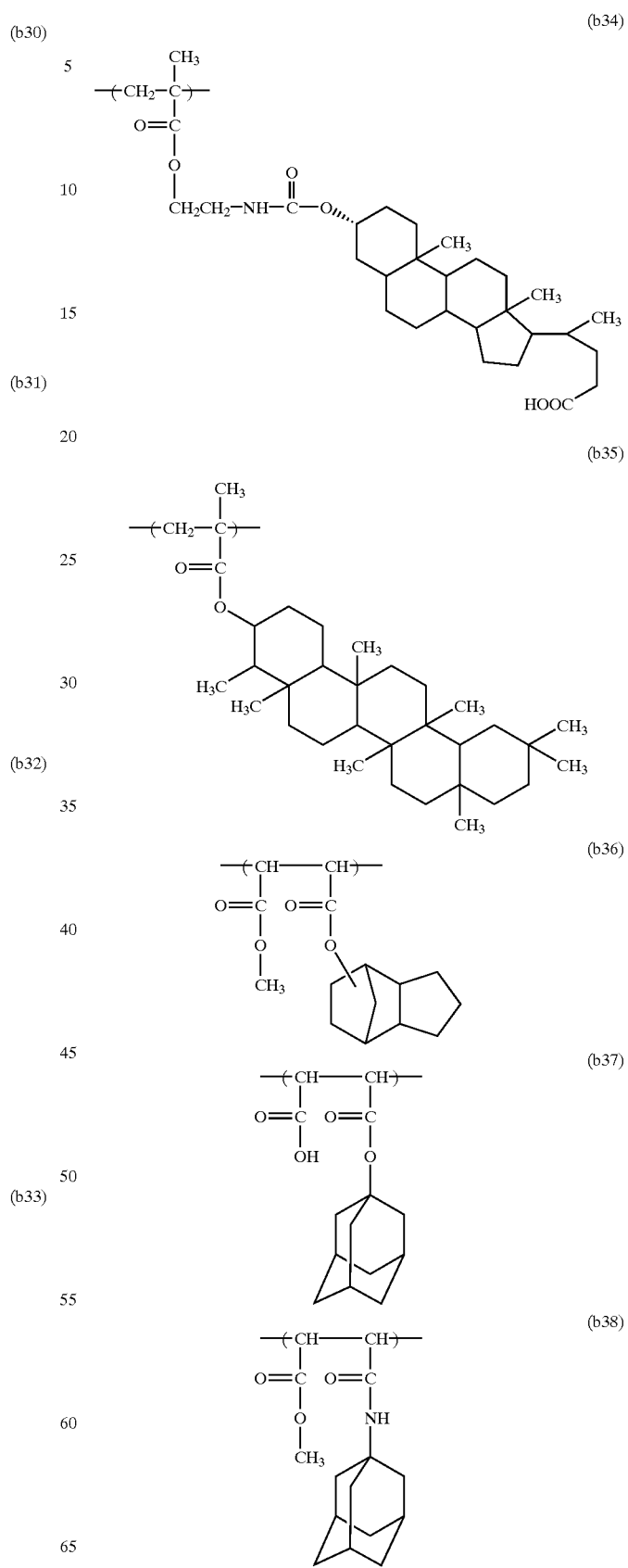

(b39) 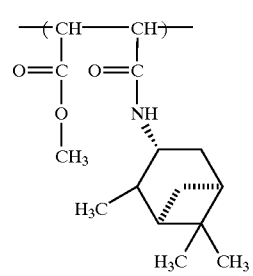
(b40) 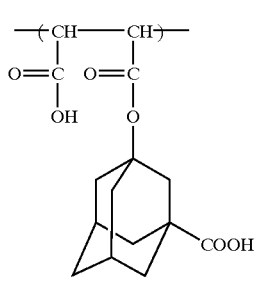
(b41) 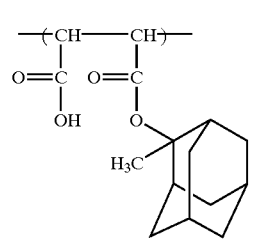
(b42) 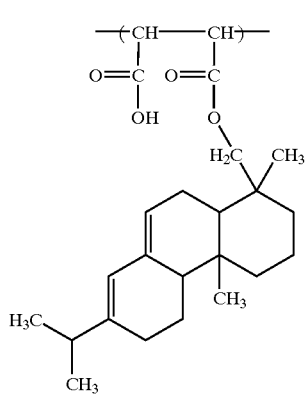
(b43) 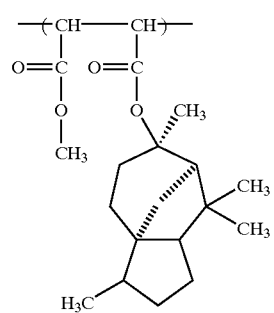
(b44) 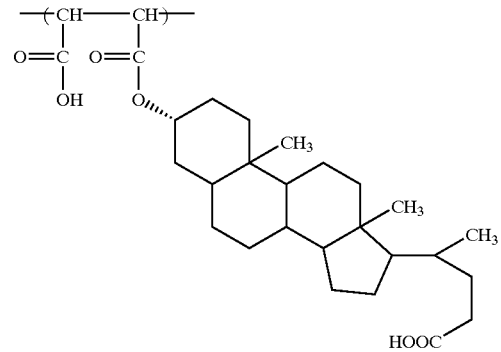
(b45) 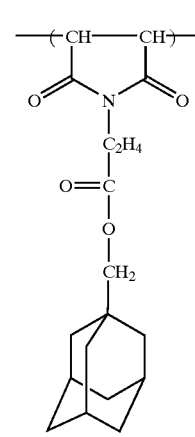 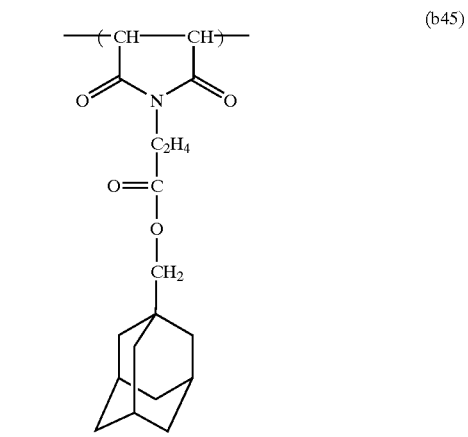
(b46) 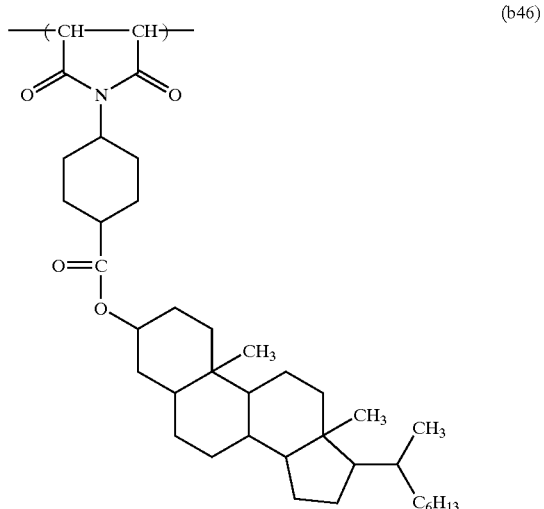
(b-47) 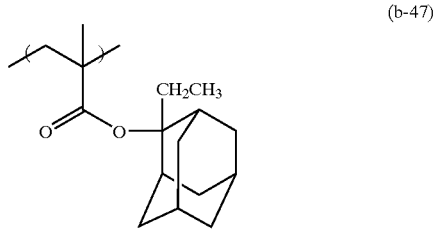

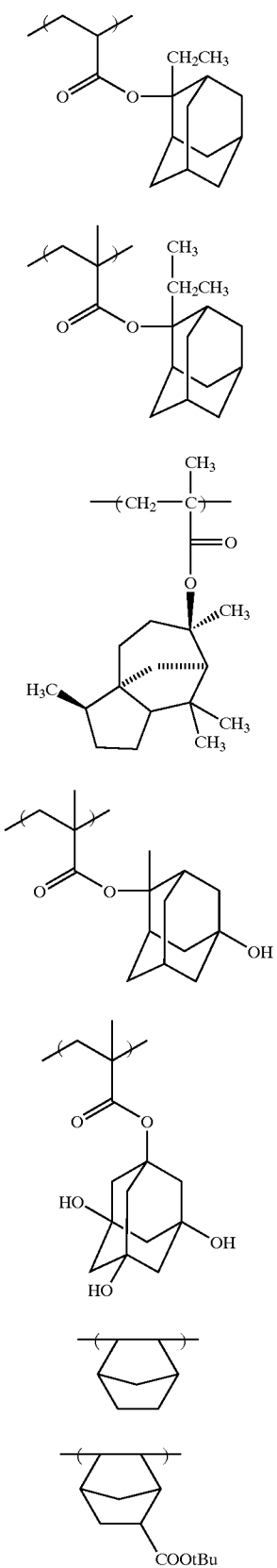
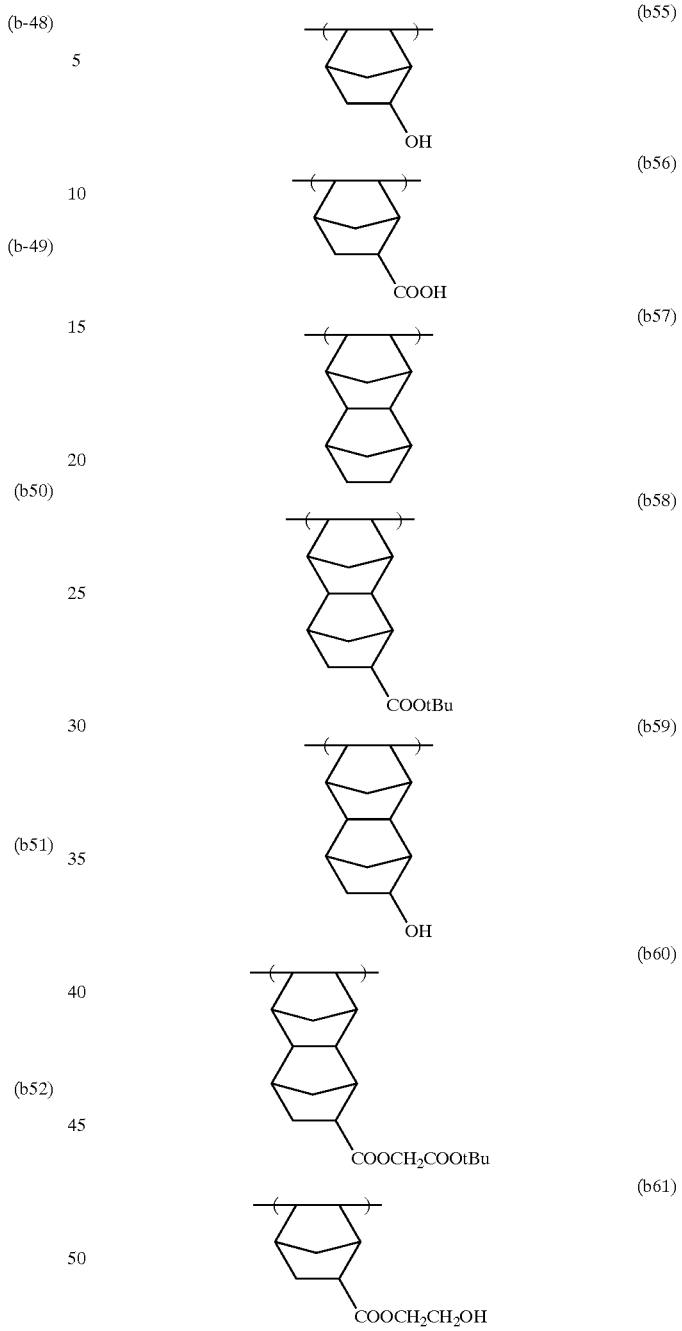

Of these specific examples, (b1), (b2), (b5), (b9), (b47), (b48), (b49), (b50), (b54), (b58) and (b60) are preferred for their acid decomposability. Above all, (b1), (b47), (b48) and (b49), in which the adamantyl group is connected by the resin main chain and the acid-decomposable structure, are preferred. These compounds contribute to the improvement of dry etching resistance and resolution.

The acid-decomposable resins as described above can further contain a carboxyl group.

A carboxyl group may be contained in the repeating structural units having the group represented by formula (I) or may be contained in repeating structural units other than these repeating units. A carboxyl group may be contained at plural positions of these structural units.

The content of the entire repeating structural units containing a carboxyl group in the positive photoresist composition of the present invention is adjusted according to performances such as alkali developing property, adhering property with the substrate and sensitivity, but is preferably from 0 to 60 mol %, more preferably from 0 to 40 mol %, and still more preferably from 0 to 20 mol %, based on the entire repeating structural units.

The specific examples of the repeating structural units containing a carboxyl group are shown below, but it should not be construed as the present invention is limited thereto.

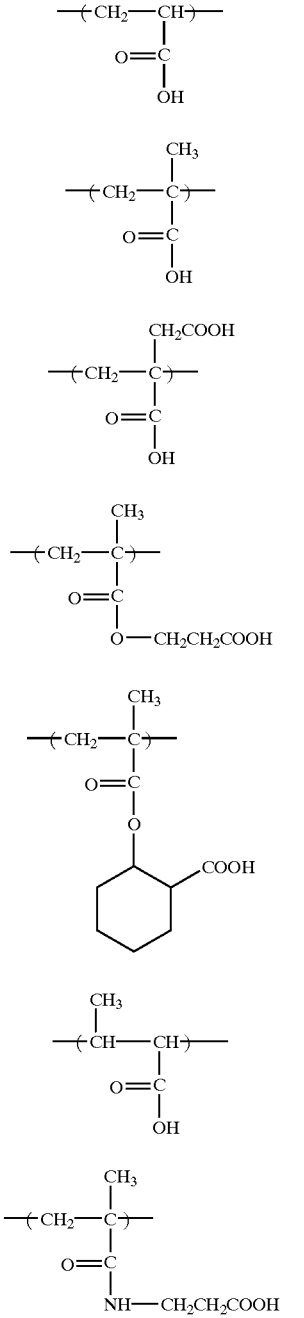

-continued

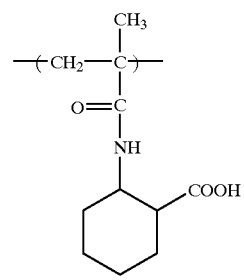

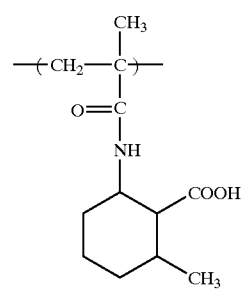

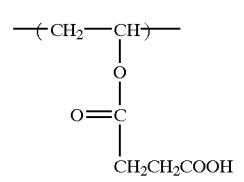

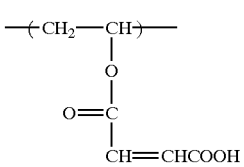

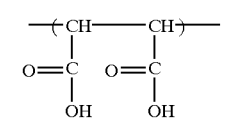

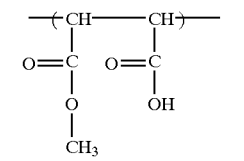

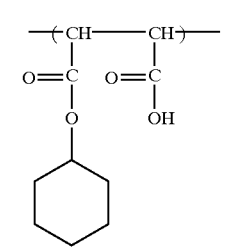

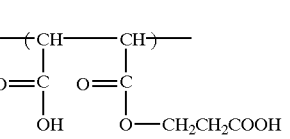

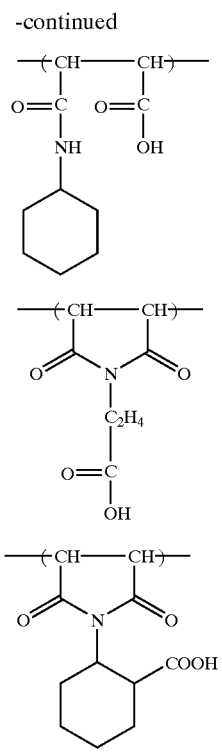

For the purpose of improving the performances of the resins of the present invention, other polymerizable monomers may be copolymerized with the resins according to the present invention within the range not noticeably impairing the permeability of light of 220 nm or less of the resins and dry etching resistance.

Examples of the copolymerizable monomers which can be used in the present invention include compounds having one addition polymerizable unsaturated bond selected from acrylic esters, acrylamides, methacrylic esters, methacrylamides, allyl compounds, vinyl ethers, vinyl esters, styrenes, crotonic esters, etc.

Specifically, the following compounds can be exemplified: acrylic esters, e.g., alkyl (the carbon atom number of the alkyl group is preferably from 1 to 10) acrylate (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, etc.), aryl acrylate, and methoxyethoxyethyl acrylate; methacrylic esters, e g., alkyl (the carbon atom number of the alkyl group is preferably from 1 to 10) methacrylate (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, etc.), aryl methacrylate (e.g., phenyl methacrylate, naphthyl methacrylate, etc.), and methoxyethoxyethyl methacrylate; acrylamides, e.g., acrylamide, N-alkylacrylamide (the alkylgroup is an alkyl group having from 1 to 10 carbon atoms, e.g., methyl, ethyl, propyl, butyl, t-butyl, heptyl, octyl, cyclohexyl, benzyl, hydroxyethyl, benzyl, etc.), N-arylacrylamide, N,N-dialkylacrylamide (the alkyl group is an alkyl group having from 1 to 10 carbon atoms, e.g., methyl, ethyl, butyl, isobutyl, ethylhexyl, cyclohexyl, etc.), N,N-arylacrylamide, N-hydroxyethyl-N-methylacrylamide, and N-2-acetamidoethyl-N-acetylacrylamide; methacrylamides, e.g., methacrylamide, N-alkylmethacrylamide (the alkyl group is an alkyl group having from 1 to 10 carbon atoms, e.g., methyl, ethyl, t-butyl, ethylhexyl, hydroxyethyl, cyclohexyl, etc.), N-arylmethacrylamide, N,N-dialkylmethacrylamide (the alkyl group is ethyl, propyl, butyl, etc.), N-hydroxyethyl-N-methylmethacrylamide, N-methyl-N-phenylmethacrylamide, and N-ethyl-N-phenylmethacrylamide; allyl compounds, e.g., allyl esters (e.g., allyl acetate, allyl caproate, allyl caprylate, allyl laurate, allyl palmitate, allyl stearate, allyl benzoate, allyl acetoacetate, allyl lactate, etc.), and allyl oxyethanol; crotonic esters, e.g., alkyl crotonate (e.g., butyl crotonate, hexyl crotonate, glycerin monocrotonate, etc.); dialkyl itaconates (e.g., dimethyl itaconate, diethyl itaconate, dibutyl itaconate, etc.), dialkyl esters of maleic acid or fumaric acid (e.g., dimethyl maleate, dibutyl fumarate, etc.), maleic anhydride, maleimide, acrylonitrile, methacrylonitrile, and maleylonitrile. Besides the above compounds, addition polymerizable unsaturated compounds which can be copolymerized can be used in the present invention.

Of the above, methoxyethoxyethyl methacrylate and methoxyethoxyethyl acrylate are particularly preferred.

The content of the repeating structural units derived from other polymerizable monomers in resin (B) according to the present invention is preferably 50 mol % or less, more preferably 30 mol % or less, based on the entire repeating structural units.

It is preferred for the resin according to the present invention not to contain aromatic rings in view of ensuring transparency to actinic rays or radiation. When the transparency to radiation is reduced due to the introduction of aromatic rings, exposure light is difficult to reach the bottom of a resist layer, which causes tapered pattern profile.

Content of Repeating Unit

The content of the repeating structural unit having an acid-decomposable group in an acid-decomposable resin is adjusted according to the balance of dry etching resistance and alkali developing property, etc., but the content is preferably 20 mol % or more, more preferably 30 mol % or more, and still more preferably 40 mol % or more, based on the entire repeating units.

The content of the structural unit having the above-described cyclic hydrocarbon group (preferably repeating structural unit represented by formula (II), (III) or (IV)) is adjusted according to the balance of dry etching resistance and alkali developing property, etc., but the content is preferably 20 mol % or more, more preferably from 30 to 80 mol %, still more preferably from 35 to 70 mol %, and most preferably from 40 to 60 mol %, based on the entire repeating units.

Further, the content of the repeating structural unit having lactone structure in an acid-decomposable resin is adjusted according to the balance of dry etching resistance and alkali developing property, etc., but the content is preferably 20 mol % or more, more preferably from 30 to 80 mol %, still more preferably from 35 to 70 mol %, and most preferably from 40 to 60 mol %, based on the entire repeating units.

In the present invention, the content of (B) a resin whose solubility in an alkali developing solution increases by the action of an acid is from 20 to 99.8 mol %, preferably from 50 to 99.5 mol %, based on the entire compositions exclusive of solvents or based on the solid content.

Other Materials

It is preferred for the composition according to the present invention to contain a basic compound and/or a surfactant. It is also preferred to contain a specific low molecular weight compound.

Basic Compound

The positive photoresist composition according to the present invention can contain (C) a basic compound, preferably a nitrogen-containing basic compound, for reducing the fluctuation of performances due to aging during the time from exposure to heating.

A preferred nitrogen-containing basic compound is represented by formula (A), (B), (C), (D) or (E) shown below:

(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be bonded to each other to form a ring;

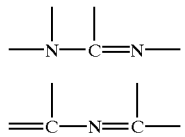
(B)

(C)

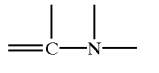
(D)

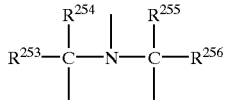
(E)

wherein $R^{253}$, $R^{254}$, $R^{255}$ and $R^{256}$, which may be the same or different, each represents an alkyl group having from 1 to 6 carbon atoms.

More preferred compounds are nitrogen-containing basic compounds having two or more nitrogen atoms of different chemical environments in one molecule, and particularly preferred compounds are those having both of a substituted or unsubstituted amino group and the ring structure containing a nitrogen atom, or those having an alkylamino group.

Specific examples of preferred compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. Examples of preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

Examples of particularly preferred compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]nona-5-ene, 1,8-diazabicyclo[5.4.0]-undeca-7-ene, and 2,4,5-triphenylimidazole, but the present invention is not limited to these compounds.

These basic compounds (C) can be used alone or in combination of two or more. The addition amount of the basic compound (C) is generally from 0.001 to 10 wt %, preferably from 0.01 to 5 wt %, based on the solid content of the photosensitive resin composition. If the content is less than 0.001 wt %, the effect of the addition of the compound cannot be obtained. On the other hand, if it exceeds 10 wt %, the sensitivity lowers and the developing property of the non-exposed area are liable to be deteriorated.

In the next place, (D) a fluorine-based surfactant and a silicon-based surfactant contained in the positive photoresist composition according to the present invention will be described below.

The positive photoresist composition according to the present invention can contain either a fluorine-based surfactant or a silicon-based surfactant, or both of them.

By incorporating (B) an acid-decomposable resin and (D) a surfactant into the positive photoresist composition according to the present invention, a resist pattern showing excellent sensitivity, resolution, adhering property and free of development defects can be obtained when exposure light sources of 250 nM or less, in particular 220 nm or less are used.

The surfactants disclosed in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988 can be used as (D) a fluorine-based surfactant and a silicon-based surfactant. The following commercially available surfactants can also be used as they are.

Fluorine-based and silicon-based surfactants which can be used in the present invention include, e.g., Eftop EF301 and EF303 (manufactured by Shin-Akita Kasei Co., Ltd.), Florad FC430 and FC431 (manufactured by Sumitomo 3M Co., Ltd.), Megafac F171, F173, F176, F189and R08 (manufactured by Dainippon Ink & Chemicals, Inc.), Surflon S-382, SC101, SC102, SC103, SC104, SC105, and SC106 (manufactured by Asahi Glass Co., Ltd.), and Troysol S-366 (manufactured by Troy Chemical Co., Ltd.). Further, polysiloxane polymer KP-341 (manufactured by Shin-Etsu Chemical Co., Ltd.) can also be used as a silicon-based surfactant.

Low Molecular Weight Compounds

The positive photoresist composition according to the present invention can contain (E) a low molecular weight compound having a molecular weight of 3,000 or less and having a group which is decomposed by the action of an acid and the solubility in an alkali developing solution increases. This low molecular weight compound functions as an acid-decomposable dissolution inhibiting compound.

As such a low molecular weight compound, alicyclic or aliphatic compounds such as cholic acid derivatives as disclosed in *Proceeding of SPIE*, Vol. 2724, page 355 (1996) are preferably used in the present invention particularly for the purpose of not reducing the permeability of light of 220 nm or less. When the acid-decomposable dissolution inhibiting compound is used in the present invention, the addition amount thereof is from 3 to 50 wt %, preferably from 5 to 40 wt %, and more preferably from 10 to 35 wt %, based on the solid content of the photosensitive resin composition.

The specific examples of low molecular weight compounds are shown below.

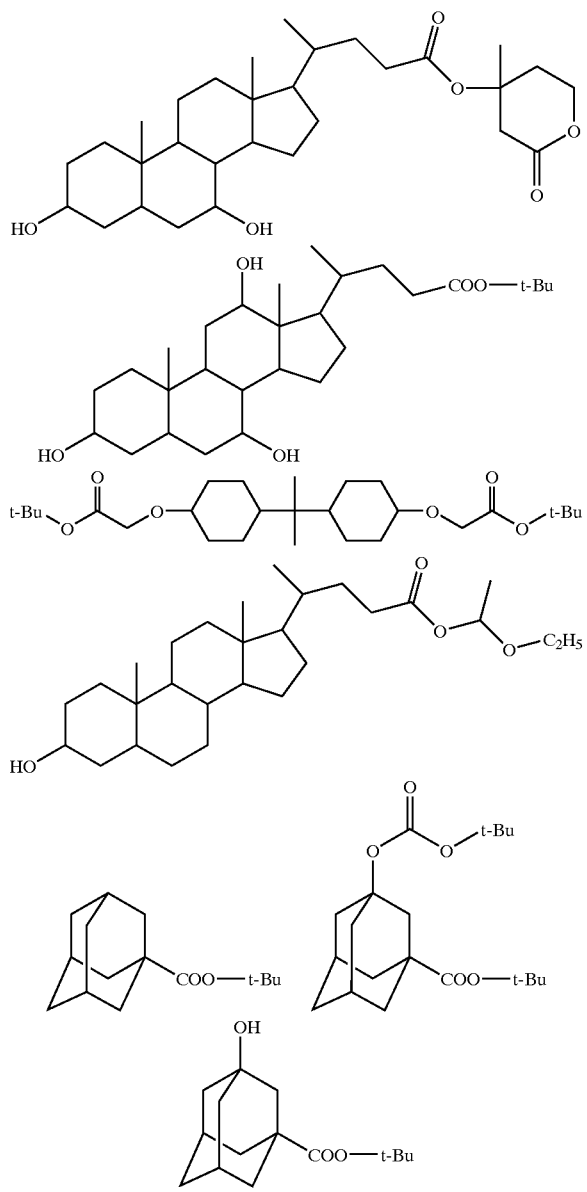

The positive photoresist composition according to the present invention can contain resins not containing an acid-decomposable group and insoluble in water and soluble in an alkali developing solution, which resins contribute to the improvement of sensitivity.

Novolak resins and polyhydroxystyrene derivatives can also be used in the present invention. However, they have large absorption to light of 250 nm or less, it is preferred to use them partially by hydrogenation or use in an amount of 30 wt % or less based on the entire resin amount.

The positive photoresist composition according to the present invention may further contain, if necessary, acid-decomposable dissolution accelerating compounds, dyes, plasticizers, surfactants other than the above-described surfactant (D), photosensitizers, and compounds which accelerate solubility in a developing solution.

Compounds which accelerate solubility in a developing solution for use in the present invention are low molecular weight compounds having two or more phenolic OH groups or one or more carboxyl group(s) and molecular weight of 1,000 or less. When compounds having a carboxyl group is used, they are preferably alicyclic or aliphatic compounds for the same reason as described above.

If the addition amount of the acid-decomposable dissolution accelerating compound is too much, development residue becomes noticeable and pattern deformation disadvantageously occurs during development.

Such a phenol compound having molecular weight of 1,000 or less can be easily synthesized with referring to the methods disclosed, e.g., in JP-A-4-122938, JP-A-2-28531, U.S. Pat. No. 4,916,210, and EP 219294.

Specific examples of phenol compounds are shown below but the present invention is not limited thereto.

There can be exemplified resorcinol, phloroglucinol, 2,3,4-trihydroxybenzophenone, 2,3,4,4'-tetrahydroxybenzophenone, 2,3,4,3',4',5'-hexahydroxybenzophenone, an acetone-pyrogallol condensation resin, phloroglucocide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl) hexane, 1,2-tetrakis(4-hydroxyphenyl)ethane, 1,1,3-tris(hydroxyphenyl)butane, and p-[α,α,α',α'-tetrakis(4-hydroxyphenyl)]xylene.

Preferred dyes are oil dyes and basic dyes. Specific examples of the dyes include Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Co., Ltd.), Crystal Violet (C.I. 42555), Methyl Violet (C.I. 42535), Rhodamine B (C.I. 45170B), Malachite Green (C.I. 42000), and Methylene Blue (C.I. 52015).

The following photosensitizers can be used for improving an acid generating rate by exposure. Specific examples of preferred photosensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin, and coronene, but the present invention is not limited to these compounds.

These photosensitizers can also be used as light-absorbing agents of actinic rays or radiation of light sources. In such a case, the light-absorbing agents reduce the reflected light from the substrate and lessen the influence of multipath reflection in the resist layer to thereby exhibit the improving effect of standing wave.

The above components of the photosensitive composition according to the present invention are dissolved in a solvent and coated on a substrate. Examples of the solvents preferably used in the present invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxy propionate, ethyl ethoxy propionate, methyl pyruvate, ethyl pyruvate, propyl pyruvate, N,N-dimethylformamide, dimethyl sulfoxide, N-methylpyrrolidone, and tetrahydrofuran. These solvents can be used alone or in combination of two or more.

Surfactants other than the above-described (D) a fluorine-based surfactant and/or a silicon-based surfactant can also be added to the photoresist composition according to the present invention. Specific examples of the surfactants preferably used in the present invention include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether, etc.), polyoxyethylene alkylaryl ethers (e.g., polyoxyethylene octylphenol ether, polyoxyethylene nonylphenol ether, etc.), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate, etc.), and polyoxyethylene sorbitan fatty acid esters (e. g., polyoxyethylene sorbitan monolaurate, polyoxyethylene sorbitan monopalmitate, polyoxyethylene sorbitanmonostearate, polyoxyethylene sorbitan trioleate, polyoxyethylene sorbitan tristearate, etc.).

These surfactants may be used alone or in combination of two or more thereof.

The above-described photosensitive composition of the present invention is coated by an appropriate coating means such as a spinner or a coater on a substrate commonly used in the manufacture of precision integrated circuit elements (e.g., a silicon/silicon dioxide-coated substrate), exposed through a predetermined mask, baked, and then subjected to development, thereby excellent resist pattern can be obtained. As the exposure light sources, rays of wavelength of preferably 250 nm or less, more preferably 220 nm or less, are preferably used. Specifically, KrF eximer laser beams (248 nm), ArF eximer laser beams (193 nm), F2 eximer laser beams (157 nm), X-rays, and electron beams can be exemplified.

The developing solution for the photosensitive composition of the present invention include, e.g., alkaline aqueous solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine.

Further, appropriate amounts of alcohols and surfactants can be added to the above alkaline aqueous solutions.

EXAMPLES

The present invention will be described in detail below, but the present invention should not be construed as being limited thereto.

Preparation Experiment 1
Synthesis of Photo Acid Generator (I-1)

Fifty (50) grams of diphenyl sulfoxide was dissolved in 800 ml of benzene, 200 g of aluminum chloride was added thereto, and the solution was refluxed for 24 hours. The reaction solution was slowly poured into 2 liters of ice, 400 ml of concentrated hydrochloric acid was added thereto followed by heating at 70° C. for 10 minutes. The aqueous solution, the solvent of which was the water resulted from melted ice, was washed with 500 ml of ethyl acetate, filtered out, and an aqueous solution of ammonium iodide obtained by dissolving 200 g of ammonium iodide in 400 ml of water was added thereto.

The precipitated powders were filtered out, washed with water successively with ethyl acetate and dried, thereby 70 g of triphenylsulfonium iodide was obtained.

Triphenylsulfonium iodide (30.5 g) was dissolved in 1,000 ml of methanol, and 19.1 g of silver oxide was added to the methanol solution obtained, followed by stirring at room temperature for 4 hours. After stirring the solution for 4 hours, the reaction solution was filtered, and the excess amount of an aqueous solution of 1-naphthalenesulfonic acid was added thereto. The reaction solution was concentrated and the precipitated powders were recrystallized from water/methanol, thereby 25.5 g of Photo Acid Generator (I-1) for use in the photosensitive composition of the present invention was obtained.

Preperation Experiment 2
Synthesis of Triarylsulfonium-1-naphthalenesulfonate Fifty (50) grams of triarylsulfonium chloride (a 50% aqueous solution of triphenylsulfonium chloride, manufactured by Fluka Co.) was dissolved in 500 ml of water, and the excess amount of an aqueous solution of 1-naphthalenesulfonic acid was added thereto to thereby precipitate an oily substance. The supernatant was removed by decantation, and the oily substance obtained was washed with water and dried, thereby triarylsulfonium salts containing compounds represented by formulae (I-9) and (II-1) as main components were obtained.

Preperation Experiment 3
Synthesis of Photo Acid Generator (III-1)

Sixty (60) grams of t-amylbenzene, 39.5 g of potassium iodate, 81 g of acetic anhydride and 70 ml of dichloromethane were mixed. Concentrated sulfuric acid (66.8 g) was gradually dropwise added with ice-cooling to the mixture obtained, followed by stirring with ice-cooling for further 2 hours successively at room temperature for further 10 hours.

After stirring at room temperature for 10 hours, 500 ml of water was added to the reaction solution with ice-cooling, and the components dissolved in the reaction solution were extracted with dichloromethane. Dichloromethane organic phase was washed with an aqueous solution of sodium hydrogencarbonate successively with water. The organic phase was concentrated after washing, thereby di(4-t-amylphenyl)iodonium sulfate was obtained. This sulfate was added to the excess amount of an aqueous solution of 1-naphthalenesulfonic acid. Water (500 ml) was added to this solution followed by extraction with dichloromethane. The organic phase was washed with a 5% aqueous solution of tetramethylammonium hydroxide successively with water, and then concentrated, thereby Photo Acid Generator (III-1) was obtained.

Other photo acid generators can also be synthesized in general in almost the same manner.

Preperation Experiment 4
Synthesis of Resin (P1) Shown in Table I
Synthesis 1
Synthesis of Resin (I-1) ((a1)/(b1)=50/50)

To 7.0 g of N,N-dimethylacetamide heated to 60° C. were dropwise added a Solution obtained by dissolving 5.0 g of 2-methyl-2-adamantane methacrylate, 4.23 g of mevalonic lactone methacrylate, and 0.534 g of a polymerization initiator 2,2'-azobis(2,4-dimethylvaleronitrile) (trade name: V-65, manufactured by Wako Pure Chemical Industries Ltd.) in 30.0 g of N,N-dimethylacetamide under nitrogen gas flow over 4 hours. After the reaction was further continued at 60° C. for 2 hours, 0.267 g of V-65 was added to the reaction solution, followed by further reaction for 2 hours. The reaction solution was poured into 1,000 ml of ion exchange water and the powders precipitated were filtered out. The filtered powders were dissolved in THF, poured into 1,500 ml of hexane and the powders obtained were dried, thereby Resin (I-1) was obtained.

The Resin (I-1) had a molecular weight of 5,500 and a degree of dispersion (Mw/Mn) of 1.9.

Preperation Experiment 5
Synthesis of Resin (P6) Shown in Table I
Synthesis 2
Synthesis of Resin (I-2) ((a5)/(b1)=50/50)

To 7.0 g of N,N-dimethylacetamide heated to 60° C. were dropwise added a solution obtained by dissolving 5.0 g of 2-methyl-2-adamantane methacrylate, 3.9 g of α-methacryloyloxy-γ-butyrolactone, and 0.534 g of a polymerization initiator 2,2'-azobis(2,4-dimethylvaleronitrile) (trade name: V-65, manufactured by Wako Pure Chemical Industries, Ltd.) in 27 g of N,N-dimethylacetamide under nitrogen gas flow over 4 hours. After the reaction was further continued at 60° C. for 2 hours, 0.267 g of V-65 was added to the reaction solution, followed by further reaction for 2 hours. The reaction solution was poured into 1,000 ml of ion exchange water and the powders precipitated were filtered out. The filtered powders were dissolved in THF, poured into 1,500 ml of hexane and the powders obtained were dried, thereby Resin (I-2) was obtained.

The Resin (I-2) had a molecular weight of 5,600 and a degree of dispersion of 1.7.

Preperation Experiment 6

Other resins P2 to P5 and P7 to P14 each having the molecular weight (degree of dispersion) shown in Table I were prepared in the similar manner as above using the monomers shown in Table I.

TABLE I

Synthesized Resins

| Resin Name | Monomers Used (ratio) | Molecular Weight (degree of dispersion) |
|---|---|---|
| (P1) | a1/b1 (50/50) | 5,500 (1.9) |
| (P2) | a1/b1/methacrylic acid (45/45/10) | 9,000 (1.9) |
| (P3) | a4/b47 (55/45) | 16,700 (1.8) |
| (P4) | a4/b5 (60/40) | 4,600 (2.2) |
| (P5) | a5/b47/methacrylic acid (45/45/10) | 8,700 (2.1) |
| (P6) | a5/b1 (50/50) | 5,600 (1.7) |
| (P7) | a18/b1 (50/50) | 23,000 (2.3) |
| (P8) | a16/b1 (50/50) | 12,300 (2.2) |
| (P9) | a16/b1/methacrylic acid (45/45/10) | 14,100 (1.9) |
| (P10) | b54/maleic anhydride (50/50) | 3,600 (2.0) |
| (P11) | b54/b55/b56 (30/50/20) | 5,400 (1.9) |
| (P12) | a1/b1/diethylene glycol monomethyl ether methacrylate (47.5/47.5/5) | 10,000 (2.4) |
| (P13) | b54/b56/b61/maleic anhydride (15/10/25/50) | 6,500 (2.0) |
| (P14) | b60/maleic anhydride (50/50) | 9,600 (1.9) |

Examples 1 to 12 and Comparative Examples 1 to 3

Preparation of Resists

Each material shown in Table II was dissolved in propylene glycol monomethyl ether acetate to prepare a solution of 15% solid concentration, image-processed according to an ordinary method and the image was evaluated.

TABLE II

| Example No. | Acid Generating Agent (g) | Resin (g) | Dissolution Inhibitor (g) | Amine (g) | Surfactant (g) |
|---|---|---|---|---|---|
| Example 1 | I-1 (0.01) | P1 (1) | — | DBN (0.005) | W-1 (0.001) |
| Example 2 | I-2 (0.01) | P2 (1) | — | DBN (0.005) | W-2 (0.001) |
| Example 3 | I-3 (0.01) | P3 (1) | — | TPI (0.005) | W-3 (0.001) |
| Example 4 | I-4 (0.01) | P4 (1) | — | TPI (0.005) | W-4 (0.001) |
| Example 5 | I-1 (0.02) | P5 (1) | — | DBN (0.005) | W-1 (0.001) |
| Example 6 | I-9/II-1* (0.01) | P6 (1) | — | DIA (0.005) | W-2 (0.001) |
| Example 7 | II-1 (0.01) | P7 (1) | — | DBN (0.005) | W-3 (0.001) |
| Example 8 | III-1 (0.01) | P8 (1) | — | DBN (0.005) | W-4 (0.001) |
| Example 9 | III-2 (0.01) | P9 (1) | — | TPI (0.005) | W-1 (0.001) |
| Example 10 | I-12 (0.01) | P10 (0.9) | t-butyl chlorate (0.1) | TPI (0.005) | W-2 (0.001) |
| Example 11 | V-3 (0.01) | P11 (1) | — | DBN (0.005) | W-3 (0.001) |
| Example 12 | V-10 (0.01) | P12 (1) | — | DIA (0.005) | W-4 (0.001) |
| Example 13 | I-12 (0.01) | P13 (1) | — | DBN (0.005) | W-1 (0.001) |

TABLE II-continued

| Example No. | Acid Generating Agent (g) | Resin (g) | Dissolution Inhibitor (g) | Amine (g) | Surfactant (g) |
|---|---|---|---|---|---|
| Example 14 | III-1 (0.01) | P14 (1) | — | TBA (0.005) | W-4 (0.001) |
| Comparative Example 1 | PAG-A (0.02) | P1 (1) | — | DBN (0.005) | W-1 (0.001) |
| Comparative Example 2 | PAG-B (0.01) | P8 (1) | — | DBN (0.005) | W-4 (0.001) |
| Comparative Example 3 | PAG-C (0.01) | P11 (1) | — | DBN (0.005) | W-3 (0.001) |

Symbols in Table II are as follows.
W-1: Megafac F176 (fluorine-based surfactant, manufactured by Dainippon Ink and Chemicals, Ltd.)
W-2: MegafacR08 (fluorine-based and silicon-based surfactant, manufactured by Dainippon Ink and Chemicals, Ltd.)
W-3: Polysiloxane Polymer KP-341 (silicon-based surfactant, manufactured by Shin-Etsu Chemical Co., Ltd.)
W-4: Troysol S-366 (silicon-based surfactant, manufactured by Troy Chemical Co., Ltd.)
TPI: 2,4,5-Triphenylimidazole
DIA: 2,6-Diisopropylaniline
DBN: 1,5-Diazabicyclo[4.3.0]-5-nonene
TBA: Tri-n-butylamine Acid generating agent in Example 6 is a triarylsulfonium salt with I-9 and II-1 as main components. PAG-A, PAG-B and PAG-C are shown below.

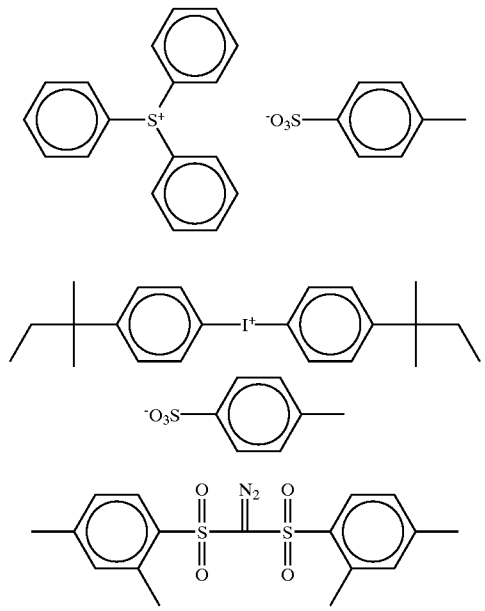

Method of Image Evaluation

Anti reflection coating DUV-42 (manufactured by Brewer Science Co., Ltd.) was coated on a silicon substrate treated with hexamethyldisilazane by a spin coater in a thickness of 600 Å uniformly, dried on a hot plate at 100° C. for 90 seconds, and then dried by heating at 190° C. for 240 seconds. Subsequently, each photosensitive resin composition was coated on the substrate by a spin coater, and dried at 130° C. for 90 seconds, thereby a resist layer having a thickness of 0.50 μm was formed. The resist layer was exposed with ArF eximer laser stepper (manufactured by ISI Co., Ltd., NA=0.6), and heated on a hot plate at 130° C. for 90 seconds immediately after exposure. The resist was development processed with a 2.38% aqueous solution of tetramethylammonium hydroxide at 23° C. for 60 seconds, rinsed with pure water for 30 seconds, and then dried, thereby resist line pattern was obtained.

The sensitivity shows the exposure amount required to reproduce mask pattern of 0.20 μm.

The resolution shows the limiting resolution by the exposure amount required to reproduce mask pattern of 0.20 μm.

The shape of the resist pattern obtained was observed with a scanning electron microscope.

The results obtained are shown in Table III.

TABLE III

| Example No. | Sensitivity (mJ/cm$^2$) | Resolution (μm) | Profile |
|---|---|---|---|
| Example 1 | 12 | 0.13 | rectangular |
| Example 2 | 16 | 0.13 | rectangular |
| Example 3 | 18 | 0.13 | rectangular |
| Example 4 | 17 | 0.13 | rectangular |
| Example 5 | 5 | 0.12 | rectangular |
| Example 6 | 15 | 0.13 | rectangular |
| Example 7 | 20 | 0.13 | rectangular |
| Example 8 | 17 | 0.13 | rectangular |
| Example 9 | 19 | 0.13 | rectangular |
| Example 10 | 16 | 0.16 | rectangular |
| Example 11 | 18 | 0.16 | rectangular |
| Example 12 | 16 | 0.15 | rectangular |
| Example 13 | 15 | 0.15 | rectangular |
| Example 14 | 16 | 0.15 | rectangular |
| Comparative Example 1 | 15 | 0.20 | tapered |
| Comparative Example 2 | 28 | 0.18 | a little tapered |
| Comparative Example 3 | 32 | 0.19 | a little tapered |

Evaluation of Image

The photoresist compositions according to the present invention form profiles of excellent rectangles and exhibit high sensitivity and high resolution as compared with the compositions in comparative examples. When the addition amount of acid generating agent is increased, resolution and sensitivity are markedly improved while retaining the profile of rectangle (Example 5).

Comparative Example 1 in which the addition amount of PAG is increased is conspicuously inferior in resolution and profile.

Due to the constitution described above, the present invention can provide positive photoresist composition excellent in sensitivity, resolution and pattern profile when light sources of wavelengths of 220 nm or less are used.

While the invention has been described in detail and with reference to specific examples thereof, it will be apparent to one skilled in the art that various changes and modifications can be made therein without departing from the spirit and scope thereof.

This application is based on Japanese patent sppplication No. Hei-11-273160, filed on Sep. 27, 1999, incorporated herein by reference.

What is claimed is:

1. A positive photoresist composition comprising
   (A) a compound which generates a sulfonic acid having naphthalene structure by the irradiation with actinic rays of a wavelength of 220 nm or less or radiation, and
   (B) a resin whose solubility in an alkali developing solution increases by the action of an acid, wherein said resin is selected from the group consisting of resins containing a monocyclic alicyclic hydrocarbon structure, a polycyclic alicyclic hydrocarbon structure and a lactone structure.

2. The positive photoresist composition as claimed in claim 1, wherein compound (A) is a compound represented by the following formula (I):

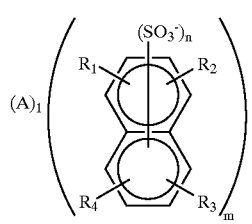

wherein A represents a sulfonium cation or an iodonium cation; $R_1$, $R_2$, $R_3$ and $R_4$, which may be the same or different, each represents a hydrogen atom, a hydroxyl group, a halogen atom, a sulfonyl group, an alkyl group, an alkoxyl group, an alkoxycarbonyl group, or an acyloxy group, at least one of $R_1$, $R_2$, $R_3$ and $R_4$ may be a group bonded to other sulfonic acid residual group via a linking group, and arbitrary two of $R_1$, $R_2$, $R_3$ and $R_4$ may be bonded to each other to form a ring by containing one or more bonding atomic group(s), selected from the group consisting of an alkylene group, —O—, —C(=O)—O—, —S—, and —CO—O—CO—; m, n and l each represents an integer of 1, 2 or 3, provided that m×n=l×(the valency of cation A).

3. The positive photoresist composition as claimed in claim 1, wherein the resin (B) contains monocyclic or polycyclic alicyclic hydrocarbon structure.

4. The positive photoresist composition as claimed in claim 1, wherein the resin (B) contains lactone structure.

5. The positive photoresist composition as claimed in claim 1, which further contains (C) a basic compound.

6. The positive photoresist composition as claimed in claim 5, which further contains (D) a fluorine-based and/or a silicon-based surfactant.

7. The positive photoresist composition as claimed in claim 6, which further contains (E) a low molecular weight compound having a molecular weight of 3,000 or less whose solubility in an alkali developing solution increases by the action of an acid.

8. The positive photoresist composition as claimed in claim 5, wherein said basic compound (C) is a nitrogen-containing basic compound having a structure represented by formula (A), (B), (C), (D) or (E):

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be bonded to each other to form a ring;

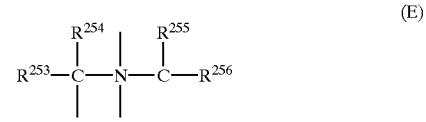

wherein $R^{253}$, $R^{254}$, $R^{255}$ and $R^{256}$, which may be the same or different, each represents an alkyl group having from 1 to 6 carbon atoms.

9. The positive photoresist composition as claimed in claim 1, which further contains (D) a fluorine-based and/or a silicon-based surfactant.

10. The positive photoresist composition as claimed in claim 1, which further contains (E) a low molecular weight compound having a molecular weight of 3,000 or less whose solubility in an alkali developing solution increases by the action of an acid.

* * * * *